(12) United States Patent
Lieber et al.

(10) Patent No.: US 8,178,907 B2
(45) Date of Patent: *May 15, 2012

(54) NANOSCOPIC WIRE-BASED ELECTRICAL CROSSBAR MEMORY-DEVICES AND ARRAYS

(75) Inventors: Charles M. Lieber, Lexington, MA (US); Thomas Rueckes, Boston, MA (US); Ernesto Joselevich, Jerusalem (IL); Kevin Kim, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 311 days.

This patent is subject to a terminal disclaimer.

(21) Appl. No.: 10/812,653

(22) Filed: Mar. 29, 2004

(65) Prior Publication Data

US 2004/0188721 A1 Sep. 30, 2004

Related U.S. Application Data

(63) Continuation of application No. 10/033,369, filed on Oct. 24, 2001, now Pat. No. 6,781,166, which is a continuation of application No. PCT/US00/18138, filed on Jun. 30, 2000.

(60) Provisional application No. 60/142,216, filed on Jul. 2, 1999.

(51) Int. Cl.
*H01L 27/10* (2006.01)
(52) U.S. Cl. .................... 257/211; 365/151; 977/932
(58) Field of Classification Search .................. 257/211; 365/151; 977/932
See application file for complete search history.

(56) References Cited

U.S. PATENT DOCUMENTS

| | | | |
|---|---|---|---|
| 2,923,920 A | 2/1960 | Fitch | |
| 3,873,359 A | 3/1975 | Lando | |
| 3,873,360 A | 3/1975 | Lando | |
| 3,900,614 A | 8/1975 | Lando | |
| 4,673,474 A | 6/1987 | Ogawa | |
| 4,939,556 A | 7/1990 | Eguchi et al. | |
| 4,979,149 A * | 12/1990 | Popovic et al. | 365/244 |
| 5,089,545 A | 2/1992 | Pol | |
| 5,274,602 A | 12/1993 | Glenn | |
| 5,352,651 A | 10/1994 | Debe et al. | |
| 5,453,970 A | 9/1995 | Rust et al. | |

(Continued)

FOREIGN PATENT DOCUMENTS

JP 11011917 A2 1/1999

(Continued)

OTHER PUBLICATIONS

C.P. Collier, et al., "Electronically Configurable Molecular-Based Logic Gates," Science, vol. 285, Jul. 16, 1999, pp. 391-394.

(Continued)

*Primary Examiner* — Howard Weiss
(74) *Attorney, Agent, or Firm* — Wolf, Greenfield & Sacks, P.C.

(57) ABSTRACT

Electrical devices comprised of nanoscopic wires are described, along with methods of their manufacture and use. The nanoscopic wires can be nanotubes, preferably single-walled carbon nanotubes. They can be arranged in crossbar arrays using chemically patterned surfaces for direction, via chemical vapor deposition. Chemical vapor deposition also can be used to form nanotubes in arrays in the presence of directing electric fields, optionally in combination with self-assembled monolayer patterns. Bistable devices are described.

1 Claim, 14 Drawing Sheets

U.S. PATENT DOCUMENTS

| | | | |
|---|---|---|---|
| 5,475,341 | A | 12/1995 | Reed |
| 5,536,968 | A | 7/1996 | Crafts et al. |
| 5,589,692 | A | 12/1996 | Reed |
| 5,640,343 | A | 6/1997 | Gallagher et al. |
| 5,677,823 | A | 10/1997 | Smith |
| 5,739,057 | A | 4/1998 | Tiwari et al. |
| 5,747,180 | A | 5/1998 | Miller et al. |
| 5,751,156 | A | 5/1998 | Muller et al. |
| 5,774,414 | A * | 6/1998 | Melzner et al. ............... 365/244 |
| 5,847,565 | A | 12/1998 | Narayanan |
| 5,858,862 | A | 1/1999 | Westwater et al. |
| 5,897,945 | A | 4/1999 | Lieber et al. |
| 5,903,010 | A | 5/1999 | Flory et al. |
| 5,948,470 | A | 9/1999 | Harrison et al. |
| 5,997,832 | A | 12/1999 | Lieber et al. |
| 6,036,774 | A | 3/2000 | Lieber et al. |
| 6,038,060 | A | 3/2000 | Crowley |
| 6,060,724 | A | 5/2000 | Flory et al. |
| 6,069,380 | A | 5/2000 | Chou et al. |
| 6,128,214 | A | 10/2000 | Kuekes et al. |
| 6,185,122 | B1 * | 2/2001 | Johnson et al. ............... 365/103 |
| 6,203,864 | B1 | 3/2001 | Zhang et al. |
| 6,256,767 | B1 | 7/2001 | Kuekes et al. |
| 6,346,189 | B1 | 2/2002 | Dai et al. |
| 6,445,006 | B1 * | 9/2002 | Brandes et al. ................. 257/76 |
| 6,528,020 | B1 | 3/2003 | Dai et al. |
| 6,536,106 | B1 | 3/2003 | Jackson et al. |
| 6,766,817 | B2 | 7/2004 | da Silva |
| 6,781,166 | B2 | 8/2004 | Lieber et al. |
| 7,172,953 | B2 | 2/2007 | Lieber et al. |
| 2002/0179434 | A1 | 12/2002 | Dai et al. |
| 2007/0161237 | A1 | 7/2007 | Lieber et al. |

FOREIGN PATENT DOCUMENTS

| | | |
|---|---|---|
| WO | WO 96/29629 A2 | 9/1996 |
| WO | WO 97/34025 A1 | 9/1997 |
| WO | WO 98/39250 | 9/1998 |
| WO | WO 98/42620 | 10/1998 |
| WO | WO 00/09443 | 2/2000 |
| WO | WO 00/17101 | 3/2000 |
| WO | WO 00/19494 | 4/2000 |
| WO | WO 01/03208 | 1/2001 |
| WO | WO 02/17362 | 2/2002 |
| WO | WO 02/48701 | 6/2002 |

OTHER PUBLICATIONS

J. Chen, et al., "Large On-Off Ratios and Negative Differential Resistance in a Molecular Electronic Device," Science, vol. 286, Nov. 19, 1999, pp. 1550-1551.

Rueckes, Thomas et al., "Carbon Nanotube-Based Nonvolatile Random Access Memory for Molecular Computing," Jul. 7, 2000, Science, vol. 289, pp. 94-97.

Office Action dated Nov. 4, 2002 for U.S. Appl. No. 10/033,369.

Collins, et al., "Nanotube Nanodevice," Science 278 (1997) pp. 100-103.

Dume, "Sizing up nanotubes," Physics Web, Jun. 28, 2006 (web article).

Kim, et al., "Electronic Density of States of Atomically-Resolved Single-Walled Carbon Nanotubes: Van Hove Singularities and End States" Phys. Rev. Lett. 82, 1225-1228 (1999).

Kong, et al., "Synthesis of Individual Single-Walled Carbon Nanotubes on Patterned Silicon Wafers", Nature 395, 878-881 (1998).

Kong, et al., "Chemical Vapor Deposition of Methane for Single-Walled Carbon Nanotubes" Chem. Phys. Lett. 292, 567-574 (1998).

Liu, et al, in "Controlled Deposition of Individual Single-Walled Carbon Nanotubes on Chemically Functionalized Templates," Chem. Phys. Lett. 303 (1999) 125-129.

Tans, et al., "Room-temperature transistor based on a single carbon nanotube," Nature 393 (1998) pp. 49-52.

Wong, et al., "Covalently Functionalized Nanotubes as Nanometer Probes for Chemistry and Biology" Nature 394, 52-55 (1998).

Wong, et al., "Covalently-Functionalized Single-Walled Carbon Nanotube Probe Tips for Chemical Force Microscopy" J. Am. Chem. Soc. 120, 8557-8558 (1998).

Yamamoto, et al., "Orientation and Purification of Carbon Nanotubes using AC Electrophoresis," J. Phys. D.: Appl. Phys. 31(8), L34-L36 (1998).

Office Action dated Apr. 7, 2006 from U.S. Appl. No. 10/973,665.
Office Action dated May 23, 2006 from U.S. Appl. No. 11/283,631.
Office Action dated Apr. 3, 2006 from U.S. Appl. No. 11/313,096.
Office Action dated Dec. 4, 2006 in U.S. Appl. No. 11/283,631.
Office Action dated Feb. 7, 2007 in U.S. Appl. No. 11/592,809.
Office Action dated Jun. 26, 2007 in U.S. Appl. No. 11/283,631.
Office Action dated Oct. 22, 2007 in U.S. Appl. No. 11/592,809.
Office Action dated Nov. 13, 2007 in U.S. Appl. No. 11/283,631.
Office Action dated Dec. 18, 2007 in U.S. Appl. No. 11/284,350.
Office Action dated Jan. 2, 2008 in U.S. Appl. No. 11/592,809.
Office Action dated May 20, 2008 in U.S. Appl. No. 11/890,366.

* cited by examiner

NANOSCOPIC WIRE-BASED ELECTRICAL CROSSBAR MEMORY-DEVICES AND ARRAYS

RELATED APPLICATIONS

This application is a continuation of U.S. patent application Ser. No. 10/033,369, filed Oct. 24, 2001, now U.S. Pat. No. 6,781,166, which is a continuation of International Patent Application Serial No. PCT/US00/18138, filed Jun. 30, 2000, which claims priority to U.S. Provisional Patent Application Ser. No. 60/142,216, filed Jul. 2, 1999.

GOVERNMENT SPONSORSHIP

This invention was sponsored by the Office of Naval Research/Defense Advanced Research Projects NIH Grant. No. GM30367 contract number N00014-99-0495. The government has certain rights in the invention.

FIELD OF THE INVENTION

The present invention relates generally to the controlled formation and/or orientation of large molecules, such as nanotubes, on surfaces, and more particularly to formation of carbon nanotubes on surfaces for making nanoscopic-scale electronic devices such as memory arrays, configurable logic and other computer elements.

BACKGROUND OF THE INVENTION

During the past several decades there has been a nearly constant exponential growth in the capabilities of silicon-based microelectronics leading, for example, to tremendous advances in our computational capabilities. Silicon-based microelectronics, however, can be made only so small. That is, there is a size limitation smaller than which silicon-based microelectronics cannot be fabricated. Specifically, the National Technology Roadmap for Semiconductors (SEMATECH, Austin, 1997) suggest that silicon-based microelectronics, which are typically said to follow "Moore's Law", will continue only to about the year 2010. At this time, two factors are expected to bring Moore's scaling to an end. First, fundamental physical limitations will be reached for both device elements and wire interconnects that will prevent current designs from functioning reliably. Second, the concurrent exponential increase in fabrication (FAB) facility cost is expected to make it uneconomical to consider increasing integration levels further (using silicon technology) even if it is physically meaningful.

These factors, and the expected benefits that could be derived from further dramatic increases in computational power in the relatively near future, have led many to consider new devices and computer architectures. In particular, there has been considerable interest in developing the concept of molecular electronics. Molecular-based electronics can in principle overcome the fundamental physical and economic limitations of silicon-based microelectronics; it is physically possible to have single molecular devices. For example, a conformational change that varies the conjugation in a molecule could behave as a switch or rectifier.

Investigation has taken place into manipulation of molecules at surfaces for electronic applications. Liu, et al, in "Controlled Deposition of Individual Single-Walled Carbon Nanotubes on Chemically Functionalized Templates," *Chem. Phys. Lett.* 303 (1999) 125-129 report procedures for producing individual, short carbon nanotube segments and for their deposition on chemically functionalized nanolithographic templates. Specifically, a patterned self-assembled monolayer is formed on a surface and a carbon nanotube is adsorbed onto the surface in an orientation corresponding to the pattern. The authors also describe connection of an individual carbon nanotube between two electrodes.

Monolayers have been used to provide molecular electronic devices. Collier et al. describes the use of a Langmuir-Blodgett film of rotaxane molecules interposed between lithographically fabricated wires of micron-scale diameter (*Science* Vol. 285, p. 391, 1999). This system is useful for read-only memory devices, however, as the configurable elements involve irreversible oxidation of the rotaxane.

Other studies report a single carbon nanotube constructed as an electronic switch (Collins, et al., *Science* 278 (1997) 100), and a room-temperature transistor (Tans, et al., *Nature* 393 (1998) 49).

To date, there has been considerable progress in characterization of the electrical behavior of individual or small numbers of molecule devices. However, a significant need exists for improvement in molecule-scale electronics, especially for integrating bistable and switchable devices for high-density memory arrays.

SUMMARY OF THE INVENTION

The present invention provides a series of nanoscopic-scale electronic elements, methods of making nanoscopic-scale electronic elements, and methods of use of nanoscopic-scale electronic elements.

In one aspect, the invention provides a nanoscopic-scale electronic device. The device is defined by an electrical crossbar array that includes at least one nanoscopic wire. The crossbar array can be of a variety of configurations such as a 1×8 array, 8×8 array, etc. The array can include contact electrodes in electrical contact with various wires, for example, by covalent attachment. Crossbar arrays provided according to the invention have densities up to about $10^{12}/cm^2$.

In another aspect the invention provides techniques for making nanoscopic-scale electronic devices. In one embodiment, the invention involves forming a nanoscopic wire on a surface in a pattern dictated by a chemically patterned surface. The nanoscopic wire can be a pre-formed wire, in which case the method involves applying the pre-formed wire to the surface in the pattern. Alternatively, the nanoscopic wire can be grown on the surface in the pattern. The chemically patterned surface can be patterned to direct assembly or growth of the nanoscopic wire in a predetermined orientation useful for a particular electronic device.

In another embodiment the invention provides a method involving growing a nanoscopic wire in the presence of an electric field. The field is of intensity sufficient to orient the growth of the wire. This method can, optionally, be used in combination with a method involving growing a nanoscopic wire on a self-assembled monolayer. In all methods, nanoscopic wire growth can be carried out via chemical vapor deposition (CVD).

In other embodiments, the invention provides a method involving forming a nanoscopic wire on a surface in a pattern dictated by a mechanically patterned surface or by gas flow.

In another aspect, the invention provides methods of using electronic devices. In one aspect, a method of the invention involves providing a crossbar array comprising at least two wires in crossbar array orientation, where the wires are free of contact with each other, and bringing the wires into contact with each other. The wires are contacted at a crossbar array junction at which they are alternately brought into contact with each other and released from contact with each other. In one embodiment the wires are nanoscopic wires.

Another aspect of the present invention provides an article comprising a self-assembled monolayer defining a delineated pattern. At least two crossed wires are associated with the self-assembled monolayer in which at least one of the wires is a nanoscopic wire. In another aspect, the invention provides an article comprising an electric crossbar array comprising at least two crossed wires defining a memory element able to be switched between at least two readable states. The device is free of auxiliary circuitry other than the at least two crossed wires defining the memory element.

In another aspect, the present invention provides a method comprising switching a memory element of a crossbar array between "on" and "off" states by alternatively biasing, at similar and opposite polarity, wires that cross the array to define the element.

In another aspect, the present invention provides an article comprising an electric crossbar array comprising at least two crossed nanoscopic wires defining a memory element capable of being switched reversibly between at least two readable states.

In another aspect, the present invention provides an article comprising an electrical crossbar array comprising at least two crossed nanoscopic wires defining a memory element capable of being switched between at least two readable states. The memory element is non-volatile.

In another aspect, the present invention provides an article comprising an electrical crossbar array comprising at least two crossed wires defining a diode. The device is free of auxiliary circuitry other than the at least two crossed wires defining the diode.

In another aspect, the present invention provides a method comprising providing a mixture of metallic nanotubes in semiconducting nanotubes. The method also involves separating the metallic nanotubes from the semiconducting nanotubes.

In all of the embodiments of the invention, preferred nanoscopic wires are nanotubes.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION OF THE INVENTION

Figure 1:
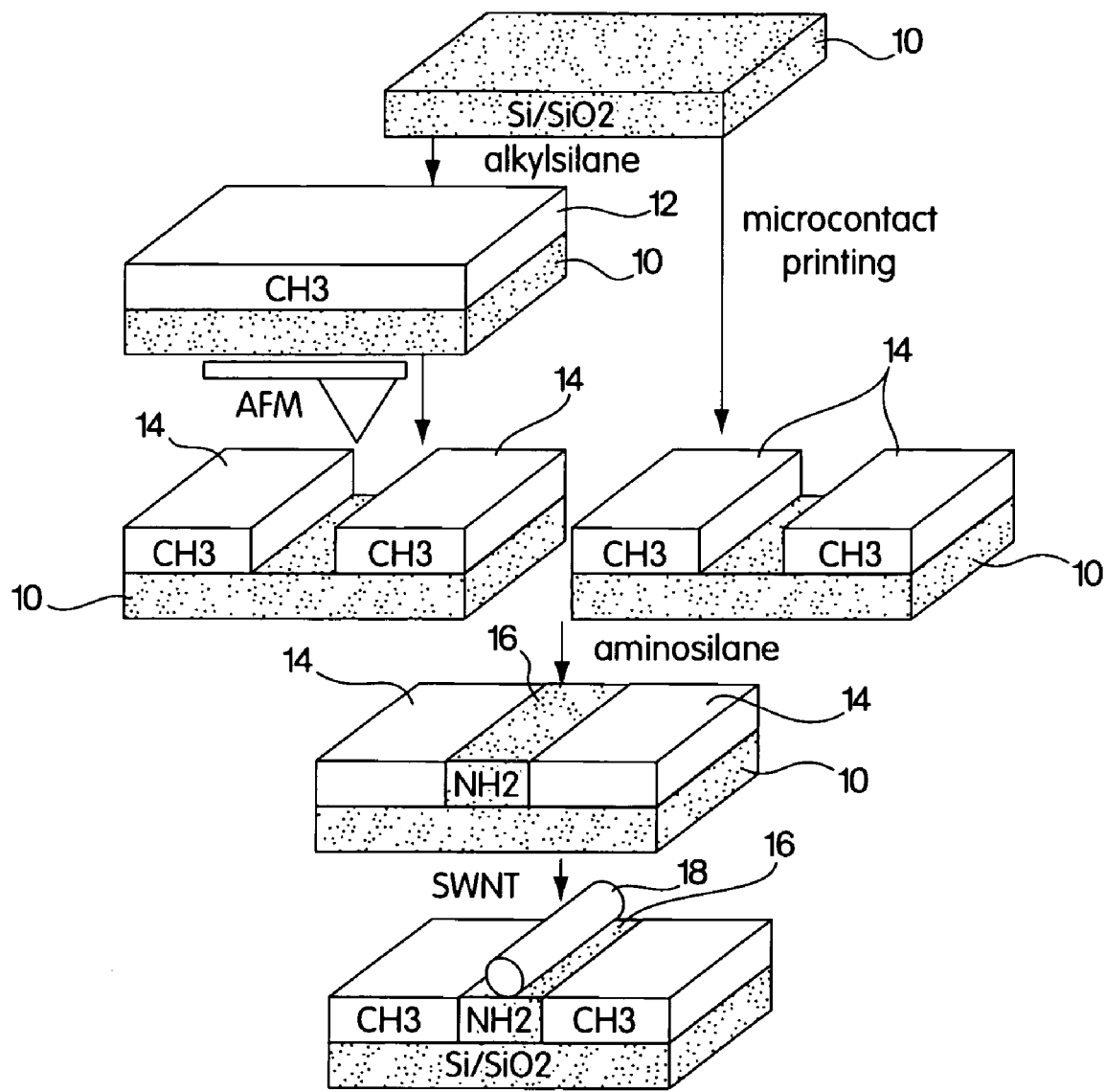
FIG. 1 illustrates, schematically, techniques for preparing a patterned self-assembled monolayer on a surface, and use of the patterned monolayer for growth of a nanoscopic wire.

The present invention provides a series of techniques and devices involving nanoscopic-scale wires, also referred to herein as "nanoscopic wires". "Nanoscopic-scale" or "nano" is meant to include elements of widths or diameters of less than 1 µm. Nanotubes are used as one example of small wires for use in the invention and, in preferred embodiments, devices of the invention include wires of scale commensurate with nanotubes. A "wire" refers to any material having a conductivity of any semiconductor or any metal.

One significant aspect of the invention involves electronic memory elements in which crossbar junctions (the intersections of crossed wires) are defined by at least one nanoscopic-scale wire. These crossbar junctions themselves can serve as both diode or memory elements of the device and as elements for switching between different states ("on" and "off" states). That is, a crossbar array device is provided in which one or more, preferably all, elements are free of auxiliary circuitry defining the elements. Current silicon based devices require a transistor and capacitor to store a bit in dynamic RAM, or four to six transistors are required to store a bit in static RAM. The present device is free of auxiliary circuitry, such as transistors and capacitors, addressing the elements to switch them between states. This is described more fully below. Of course, "free of auxiliary circuitry defining the elements" does not encompass electrodes and power sources or other macroscopic elements required to operate the device which are outside the nanoscopic memory element array.

In all of the exemplary embodiments described herein, circuitry including at least one nanoscopic-scale wire is described. Nanotubes, in particular carbon nanotubes, are primarily described and shown as examples of nanoscopic-scale wires. While nanotubes, and in particular carbon nanotubes, are preferred for use in the invention, any nanoscopic-scale wires can be used, including nanoscopic wires such as nanorods, nanowires, organic and inorganic conductive and semiconducting polymers, and the like. Other conductive or semiconducting elements that may not be molecular wires, but are of various small nanoscopic-scale dimension, also can be used in some instances (described more fully below), e.g. inorganic structures such as main group and metal atom-based wire-like silicon, transition metal-containing wires, gallium arsenide, germanium, cadmium selenide structures, thin metal wires formed by lithographic techniques, and the like. A wide variety of these and other nanoscopic-scale wires can be grown on and/or applied to surfaces in patterns useful for electronic devices in a manner similar to techniques described herein involving nanotubes, without undue experimentation. The criteria for selection of nanoscopic wires and other conductors or semiconductors for use in the invention are based, in some instances, mainly upon dimension to achieve high-density memory devices, and in other instances based on dimension and robustness. The wires should be able to be formed of at least one micron, preferably at least three microns, more preferably at least five microns, and more preferably still at least ten or twenty microns in length, and preferably are less than 100 nanometers, more preferably less than 75 nanometers, and more preferably less than about 50 nanometers, and more preferably still less than about 25 nanometers in thickness (height and width). The wires should have an aspect ratio (length to thickness) of at least about 10:1, preferably greater than about 1000:1. Selection of suitable conductors or semiconductors, including nanoscopic wires, will be apparent and readily reproducible by those of ordinary skill in the art with the benefit of the present disclosure.

A preferred nanoscopic-scale wire (i.e. nanoscopic wire) for use in devices of the invention can be either a nanotube or a nanowire. Nanotubes (e.g. carbon nanotubes) are hollow. Nanowires (e.g. silicon nanowires) are solid. Whether nanotubes or nanowires or other nanoscopic scale wires are selected, it is preferred that they be selected among those that are robust.

The invention facilitates reliable connection of input/output electronic lines to nanoscopic devices in a highly integrated system such that the state of the device, or individual junctions, is readable in the presence of many other connected elements. System architectures of the invention are defect and/or fault tolerant. Single wall nanotubes (SWNTs) are particularly preferred as they exhibit unique structural, electronic, and chemical properties that are particularly suitable for molecular electronics. Structurally, SWNTs are formed of a single graphene sheet rolled into a seamless tube with a diameter on the order of 0.5-5 nm and a length that can exceed 10 microns. Depending on diameter and helicity, SWNTs can behave as one-dimensional metals or semiconductor and are currently available as a mixture of metallic and semiconducting nanotubes. Methods of manufacture of nanotubes, including SWNTs, and characterization are known. Methods of selective functionalization on the ends and/or sides of nanotubes also are known, and the present invention makes use of these capabilities for molecular electronics. The basic structural/electronic properties of nanotubes can be used to create connections or input/output signals, and nanotubes have a size consistent with molecular scale architecture.

Structural and/or chemical changes associated with preferred nanoscopic-scale wires used in the invention can modulate the properties of the wires and create electronic devices of a variety of types. In addition, covalent and non-covalent chemistry can be used to direct, with molecular precision, the assembly of these wires into structures on a massively parallel scale.

Preferred nanoscopic wires of the present invention also are individual nanotubes, preferably individual SWNTs. As used herein, "individual nanotube" means a nanotube free of contact with another nanotube (but not excluding contact of the type desired between individual nanotubes in a crossbar array or other electronic device, as described herein). Typical individual nanotubes can have a thickness as small as 0.5 nm. This is in contrast to nanotubes produced primarily by laser vaporization techniques that produce high-quality materials, but materials formed as ropes having diameters of 2-50 nanometers or more and containing many individual nanotubes (see, for example, Thess, et al., "Crystalline Ropes of Metallic Carbon Nanotubes" *Science* 273, 483-486 (1996), incorporated herein by reference). While nanotube ropes can be used in the invention, individual nanotubes are preferred.

The invention preferably utilizes metal-catalyzed CVD to synthesize high quality individual nanoscopic-scale wires such as nanotubes for molecular electronics. CVD synthetic procedures needed to prepare individual wires directly on surfaces and in bulk form are known, and can readily be carried out by those of ordinary skill in the art. See, for example, Kong, et al., "Synthesis of Individual Single-Walled Carbon Nanotubes on Patterned Silicon Wafers", *Nature* 395, 878-881 (1998); Kong, et al., "Chemical Vapor Deposition of Methane for Single-Walled Carbon Nanotubes" *Chem. Phys. Lett.* 292, 567-574 (1998), both incorporated herein by reference.

One aspect of the present invention provides an article comprising an electrical crossbar array comprising at least two crossed wires. The array can comprise an n×m array in which n and m can be the same or different and each is an integer greater than 0. Thus, at least two crossed wires can comprise a 1×1 array or a much larger array. At least one of the crossed wires is a nanoscopic wire. For ultra-dense arrays, it is preferred that all of the wires in the array are nanoscopic wires to provide small device sizes. Other devices, however, may not require such ultradense arrays and to reduce costs, non-nanoscopic wires can be used in conjunction with nanoscopic wires. Alternatively, nanoropes can be used exclusively or in conjunction with nanotubes.

Figure 8:
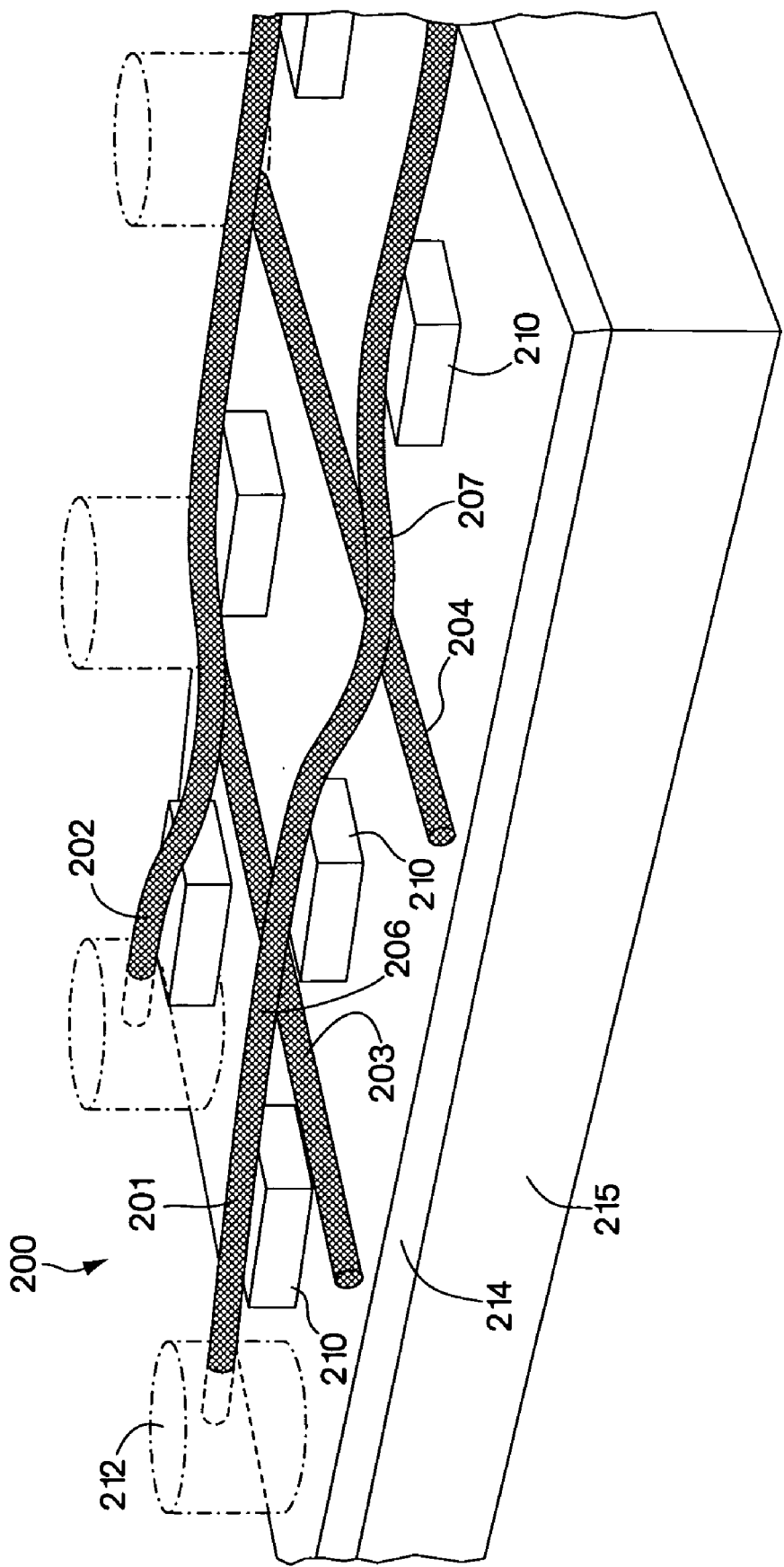
FIG. 8 shows a schematic of a device of the invention featuring a crossbar array.

FIG. 8 shows an example of a crossbar array of the present invention. In FIG. 8, crossbar array 200 comprises wires 201-204 supported, by various means, on a substrate comprising a thin dielectric layer 214 (e.g., $SiO_2$) which terminates conducting layer 215 (e.g., highly doped silicon). Wire 203 is parallel to wire 204 and these are crossed with parallel wires 201 and 202. FIG. 8 shows wires 201 and 202 perpendicular to wires 203 and 204, and typically this arrangement provides high symmetry, allowing facile integration with other systems. Of course, wires do not have to be crossed at 90° angles and can be crossed at any angle as desired.

At least two crossed wires can define a junction, e.g., wire 201 is disposed adjacent wire 203 at junction 206. "Disposed adjacent" does not require that wires 201 and 203 be in contact with each other, but rather that wires 201 and 203 are positioned relative to each other such that they are capable of contacting each other. The wires can be free of contact with no other material intermediate the wires, or spacing between the wires can be provided with the aid of intermediary material (for example, see FIGS. 5 and 6 and accompanying discussion). The ability of the crossed wires to contact and release from each other reversibly at cross point junctions provides the basis for addressable elements, such as switches, memory elements and diode junctions.

In one embodiment, wires 203 and 201 are disposed adjacent each other by positioning wire 203 directly on substrate 214. Wire 203 (and 204) is referred herein as an example of a "bound" wire. Wire 203 is intermediate substrate 214 and wire 201. Wire 201 is supported above wire 203, relative to substrate 214, by supports 210. Wire 201 (and 202) is referred herein as an example of a "supported" wire. Supports 210 can be spaced periodically on either side of each bound wire (e.g., wires 203 and 204). This arrangement of supports 210 allows each junction (e.g., junctions 206 and 207) to be addressed independently of each other.

Figure 10A:
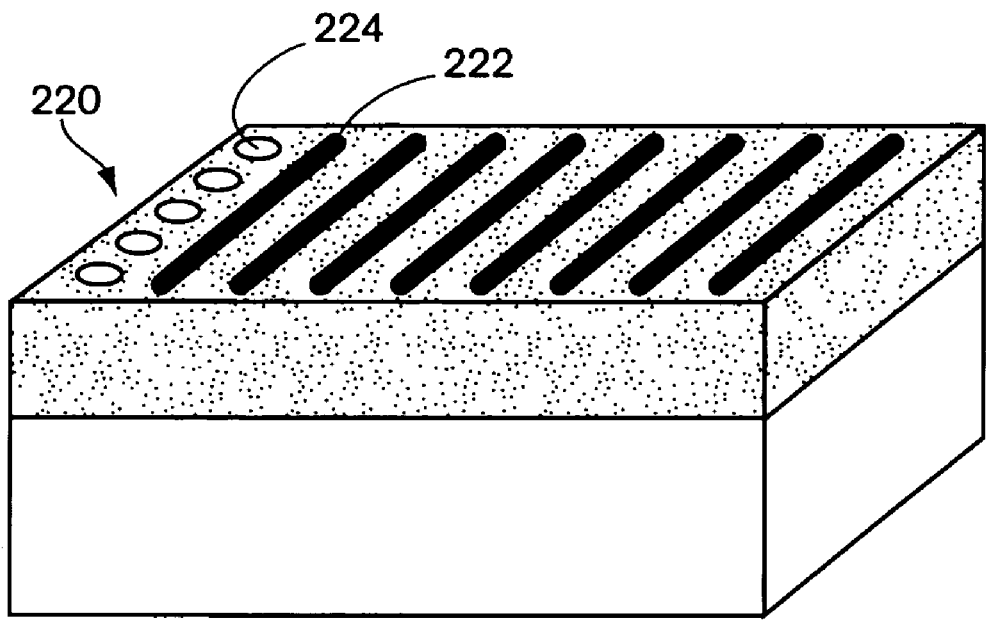
FIG. 10A shows a schematic of an article having parallel trenches and catalyst nanoparticles for the production of crossed wires.
Figure 10B:
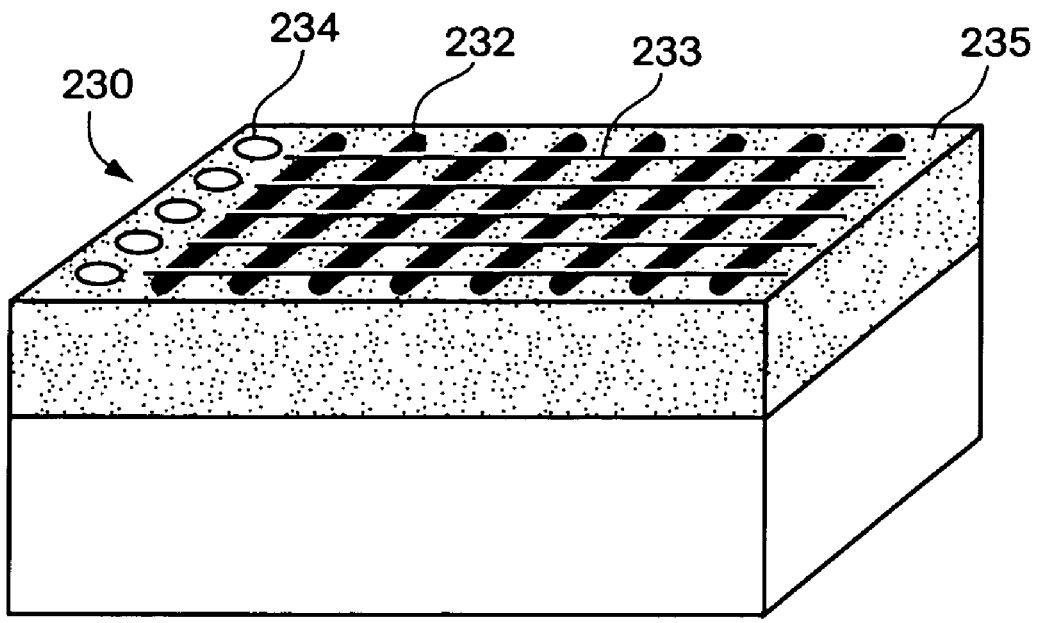
FIG. 10B shows a device having a crossbar array of nanowires in parallel trenches crossed by nanowires positioned over the trenches.

In another embodiment, wires 201 and 203 can be disposed adjacent each other by positioning wire 203 in a trench. Referring to FIG. 10B, device 230 features parallel trenches 232. Bound wires are nested in each of trenches 232 which are of sufficient depth to prevent the bound wires from projecting above substrate surface 235. A parallel array of crossed wires 233 can be positioned across trenches 232. Again, bound and support wires should have sufficient spacing from each other to allow contact with each other and release from each other at junctions.

Referring back to FIG. 8, at least one end of each of wires 201-204 is in electrical contact with one of contact electrodes 212. That is, in one embodiment, at least one wire is attached to the contact electrode. The attachment can be provided by covalently attaching at least one wire to the contact electrode. The electrode can comprise any material capable of electrical conduction, as is known in the art.

FIG. 8 shows wires 201 and 203 not in contact, i.e., free of contact, with each other. "Free of contact" refers to a sufficient gap between crossed wires such that there is no conduction pathway between wires 201 and 203. Supported wires such as wire 201 preferably are selected to possess a stiffness to allow periodic support above, yet free of contact with, wire 203.

In contrast, wires 201 and 204 are in contact with each other at junction 207. "Contact" can refer to electrical contact, in which there is a conduction pathway between wires 201 and 204, or in van der Waals contact with each other. Often, for conducting wires, van der Waals contact provides electrical contact. To achieve such contact, wire 201 is capable of deformation localized at a region around junction 207. Thus, the wire of the present invention should have a sufficient Young's modulus such that the wire is capable of deformable van der Waals contact with the crossed wire at junction 207. In addition, this deformation occurs without affecting neighboring junctions, i.e., wires at neighboring junctions can independently undergo deformation or remain free of contact with a crossed wire.

It is another feature of the array of the present invention that deformation occurs via application of a stimulus. Typically, the stimulus is an electrical stimulus as provided through the at least one electrode 212. A stimulus can comprise biasing the two crossed wires with opposite polarities such that electrical attraction causes wire 201 to deform towards wire 207. In addition, wires 201 and 204 preferably are selected to have sufficient adhesion energy to maintain deformable van der Waals contact upon removal of the stimulus. Thus, no applied energy is required in preferred embodiments to maintain wires 201 and 204 in contact with each other. The benefits of this capability are discussed below with respect to the potential for the crossbar array of the present invention to provide bistable (i.e. non-volatile) elements.

It can be seen that bound wires 203 and 204 do not require deformation of any type. Supported wires 201 and 202, however, should have sufficient stiffness to remain supported above bound wires, yet have sufficient flexibility to enable deformation to contact the bound wires without breaking and have sufficient adhesion energy to maintain van der Waals contact. Furthermore, supported wires 201 and 202 should be of sufficient robustness to withstand the strain of several deformation processes. Carbon nanotubes possess all these properties and are a preferred material for supported wires of the crossbar array. Of course, carbon nanotubes can be used as the bound wires. In addition, the supported wires should have enough friction to prevent slippage on supports, particularly during deformation processes. The interaction with the support could be further enhanced through chemical modification, if required, although this is not always necessary.

A device that is capable of maintaining at least two different states, e.g., contact between crossed wires or lack of contact between crossed wires without the need for applied energy to maintain either state, is referred to as a "bistable" device. As an example, bistable device elements provided by the invention at junctions of crossbar arrays will now be described. Bistable elements of the invention include those in which each of the two states is stable or metastable. These bistable elements have, as a common feature, nanoscopic scale electromechanical switching between "on" and "off" states where the "on" state involves nanoscopic-scale wires in electrical contact at the crossbar junction and in the "off" state the nanoscopic-scale wires are free of electrical contact (separated). Reading the "on" or "off" state of any cross junction is easily accomplished by measuring the resistance/conductance of the junction. The two states in this device architecture can be easily distinguished independent of fluctuations in the "on" state resistance. The "off" state conductance is lower than a conductance of the "on" state to an extent limited only by detection sensitivity, for typical bistable structure parameters. For example, for carbon nanotubes calculations suggest a change in "on" to "off" state resistance by a factor of $10^3$ to $10^6$ for typical device parameters (i.e. for typical nanotube separations in the "off" state). The device architecture and function is thus highly robust.

Figure 2:
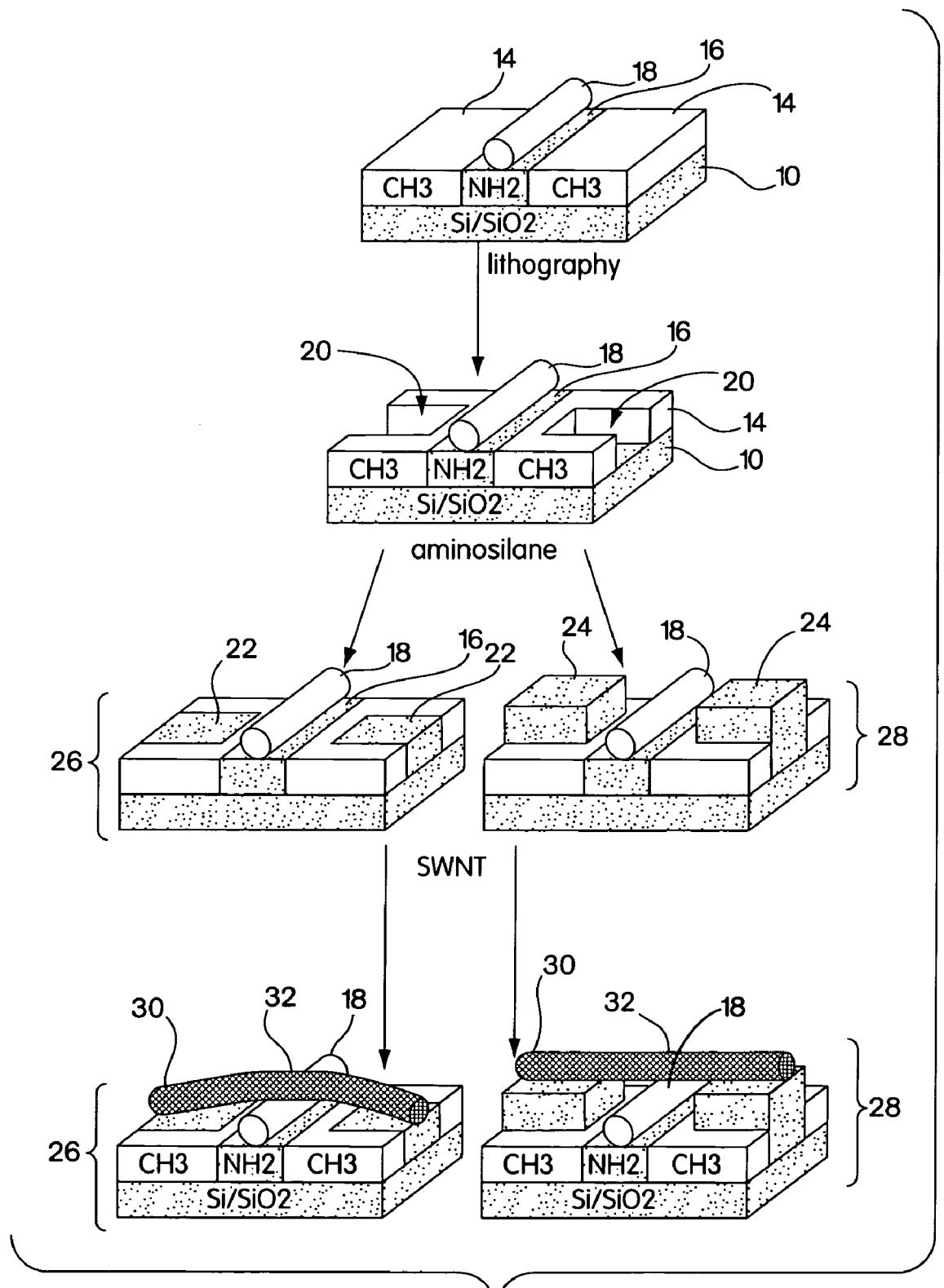
FIG. 2 illustrates, schematically, use of patterned self-assembled monolayers for formation of overlapping (intersecting) nanoscopic wires.

The operation of bistable switching elements of the invention now will be described with reference to FIG. 2. FIG. 2 shows arrangement 26 and 28, each including a crossbar array junction 32. With reference to arrangement 28 of FIG. 2, the "off" state is at mechanical equilibrium, i.e. when the crossed nanotubes are separated as illustrated. As a voltage is established between wires 18 and 30 that attracts them to each other, wire 30 is deflected towards wire 18 and contacts wire 18, defining the "on" state, corresponding to van der Waals contact. The conduction between the crossing nanoscopic wires is either high or low in the "on" and "off" states, respectively. In the "on" state, the conduction is defined by the approximate constant wire/wire contact at the cross. In the "off" state, conduction occurs by quantum mechanical tunneling and will be much lower. The bistable device includes stable minima at both the "off" and "on" states by virtue of mechanical equilibrium and van der Waals contact, respectively, and can be switched "on" by biasing the nanotubes with opposite polarity. The electrostatic term lowers the potential minimum at contact and ultimately eliminates the barrier between "off" and "on" states to enable switching. Removal of the potential leaves the system in a stable "on"

state. The device can be switched to the "off" state in a similar manner by applying the same potential to both tubes. Switching between the "on" and "off" states at reasonable (approximately 4-5 Volts) potentials is facilitated. A second general class of electromechanical switches (e.g. arrangement 26 of FIG. 2) are based on crossbar SWNT arrays that are initially in a contact "on" state at rest, but when electrostatically separated enter a second potential "off" minimum.

Nanoscopic-scale devices of the invention can exhibit switching times on the order of 6-30 picoseconds, thus they can operate at a frequency of as high as about 200 GHz. Thus, the invention encompasses low frequency devices also. Moreover, the energy to switch an individual device is extremely small. Much lower power is required than for silicon DRAMs at similar frequencies. Additionally, nanotubes have extremely good thermal conductivity along their tube axes and thus are an ideal structure for removing heat from a highly integrated device.

In addition, the nanoscopic-scale device of the present invention displays stability at a wide range of temperatures, limited only by the stability of the metal contacts. For example, memory elements provided from carbon nanotubes exhibit an intrinsic thermal stability up to or higher than 1000° C. The memory elements also exhibit radiation stability and non-volatility of the stored information.

Figure 4A:
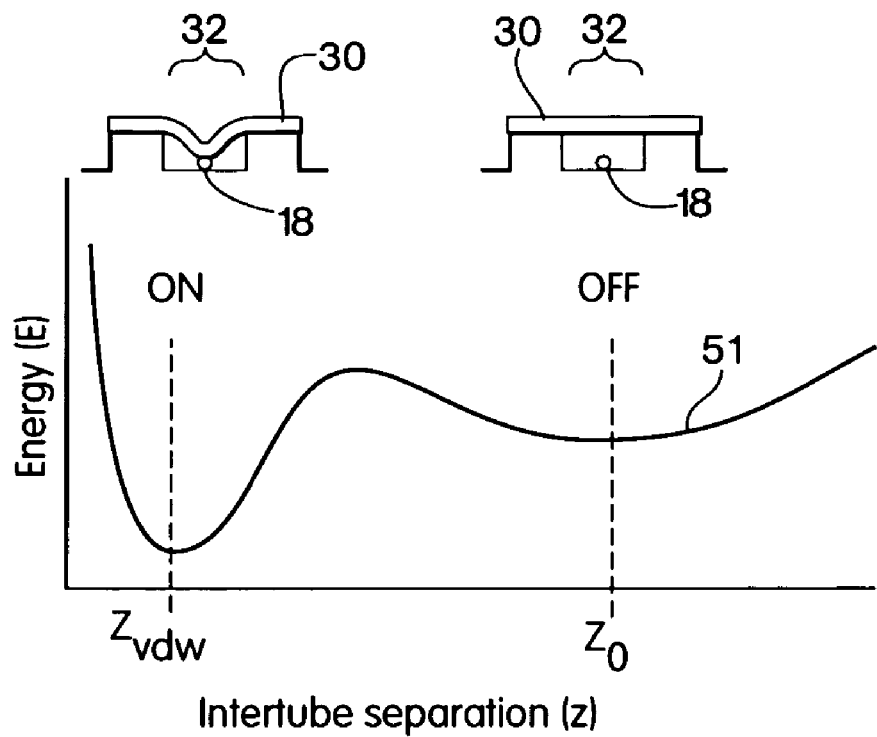
FIG. 4 illustrates, schematically and graphically, a bistable nanoscopic wire junction (memory element) and switching mechanism in terms of energy.
Figure 4B:
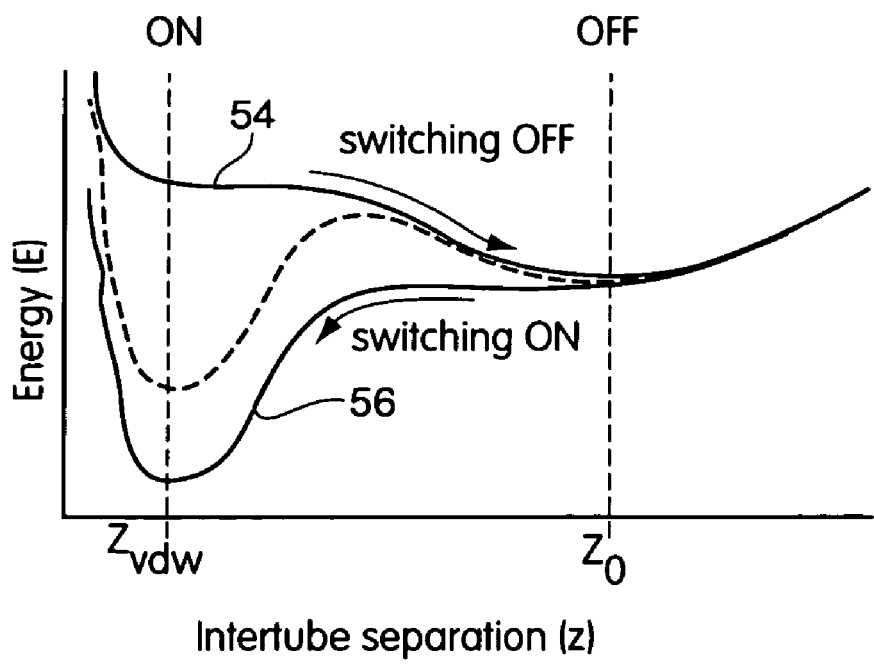

FIG. 4 illustrates, schematically, energy curves associated with "on" and "off" states of a memory element 32 of a device according to one embodiment of the invention in which a first electronic conductor is suspended above and free of contact with a second electrical conductor in its lowest energy configuration (e.g. arrangement 28 of FIG. 2). Curve 51 represents the energy states in the various conformations. The lowest energy configuration at mechanical equilibrium is the "off" state where the crossed conductors are separated. The "on" state corresponds to a Van der Waals contact. Conduction between the crossed wires is high in the "on" state and low in the "off" state. Switching is carried out as follows. Switching from the "off" state to the "on" state (following the energy plot of curve 56) is carried out by biasing the wires 18 and 30 with opposite polarity so that they are attracted toward each other until reaching a stable Van der Waals contact distance ($Z_{vdw}$). Switching "off", following the energy plot of curve 54, is accomplished by biasing wires 18 and 30 with the same polarity so that they repel each other, moving toward their mechanical equilibrium distance ($Z_0$). The device of the invention is highly efficient in that switching between "off" and "on" states can be carried out at approximately 4-5 volts, and no external power is required to maintain the wires in either the "on" or "off" states (i.e. bistable, non-volatile).

The "off" and "on" states can be read easily by measuring a resistance of the junctions. In one embodiment, a difference between the resistance between two crossed wires must be sufficient to differentiate between the "on" and "off" position.

One aspect of the invention involves the spatially-controlled formation of nanoscopic-scale wires into well-defined crossbar arrays. Two general techniques for spatially-controlled formation are described herein, one involving directed assembly of pre-formed nanoscopic-scale wires onto a surface in a desired pattern, and the second involving growth of nanoscopic-scale wires on a surface in a desired pattern directed, for example, by electric fields, highly-directional precursor flow rates ("precursor wind"), template-directed growth (growth within host channels; mechanically-directed growth), growth and assembly within host materials such as self-assembled block copolymers, inorganic host structures, and the like. Relatively simple (1×1) crossbar arrays are provided in addition to more highly integrated arrays, for example, 1×8, 8×8, 16×16 arrays, etc. The arrays can serve as memory devices, where junctions of the arrays can function as memory elements. Alternatively, the junctions can serve as diodes, for overcoming problems such as cross-talk, as described below.

Referring now to FIG. 1, a technique for directed assembly of a pre-formed nanoscopic wire onto a chemically patterned surface is illustrated schematically. In FIG. 1 a silicon/silicon dioxide substrate 10 is provided and coated with a self-assembled monolayer (SAM) 12 of alkylsilane, uniformly. In one example of patterning the SAM for directed assembly of nanoscopic scale circuitry atomic force microscopy (AFM) then is used to write, at high resolution, a pattern in SAM 12 at which the SAM is removed. The pattern can be for example linear, or a crossed array of lines linear in embodiments for making nanoscopic crossed arrays. As illustrated, the pattern is linear and results in a linear patterned SAM 14 on substrate 10 defining lines of alkylsilane separated by a linear region free of SAM. In another technique, microcontact printing can be used to apply patterned SAM 14 to substrate 10. Microcontact printing is described below.

Next, open areas in the patterned surface (the SAM-free linear region between linear SAM 14) is filled with an amino-terminated SAM that interacts in a highly specific manner with a nanoscopic wire such as a nanotube. The result is a patterned SAM, on substrate 10, including linear SAM portions 14 of methyl terminated material (methyl groups exposed at the surface) separated by a line 16 of amino-terminated SAM material. Of course, any desired pattern can be formed where regions of the amino-terminated SAM material corresponds to regions at which wire deposition is desired. The patterned surface then is dipped into a suspension of wires, e.g. nanotubes, and rinsed to create an array in which wires 18 are located at regions 16 of the SAM. Where nanotubes are used, an organic solvent such as dimethyl formamide can be used to create the suspension of nanotubes. Suspension and deposition of other nanoscopic-scale wires is achievable with easily selected solvents.

Any of a variety of substrates and SAM-forming material can be used along with microcontact printing techniques, such as those described in international patent publication WO 96/29629 of Whitesides, et al., published Jun. 26, 1996 and incorporated herein by reference. Patterned SAM surfaces can be used to direct a variety of nanoscopic wires or nanoscopic-scale electronic elements. SAM-forming material can be selected, with suitable exposed chemical functionality, to direct assembly of a variety of electronic elements. Electronic elements, including nanotubes, can be chemically tailored to be attracted specifically to specific, predetermined areas of a patterned SAM surface. Nanotubes are particularly suitable for chemical functionalization on their exterior surfaces, as is well known.

Chemically patterned surfaces other than SAM-derivatized surfaces can be used, and many techniques for chemically patterning surfaces are known. Suitable exemplary chemistries and techniques for chemically patterning surfaces are described in, among other places, international patent publication serial no. WO 97/34025 of Hidber, et al, entitled, "Microcontact Printing of Catalytic Colloids", and U.S. Pat. Nos. 3,873,359; 3,873,360; and 3,900,614, each by Lando, all of these documents incorporated herein by reference. Another example of a chemically patterned surface is a micro-phase separated block copolymer structure. These structures provide a stack of dense lamellar phases. A cut through these phases reveals a series of "lanes" wherein each lane represents a single layer. The block copolymer is typically an alternating block and can provide varying domains by which to dictate growth and assembly of a nanoscopic wire.

While FIG. 1 illustrates, schematically, assembly of a nanoscopic wire on a SAM in a pattern dictated by the SAM, and a SAM defining a delineated pattern with a nanoscopic wire associated with the self-assembled monolayer, FIG. 2 illustrates, schematically, creation of a crossed microscopic wire array using self-assembled monolayer pattern direction. In FIG. 2 a substrate 10 including a SAM pattern having portions 14 and 16, as described with reference to FIG. 1, and a microscopic wire 18 formed on portion 16 of the SAM is illustrated. AFM or another technique (e.g., electron-beam lithography, etc.) can be used to write a linear pattern orthogonal to the original wire orientation in regions 20 of sections 14 of the SAM. Next, the open areas in the patterned surface are filled with amino-terminated SAM of the same length (amino-terminated SAM sections 22) or greater length (SAM sections 24) compared to the original SAM pattern. This results in an arrangement 26 in which all SAM material is of the same height, or an arrangement 28 in which portions of the SAM arrangement extend above the plane of the original SAM and, optionally, above the height of the wire 18 to provide clearance above the wire. The patterned surface then is dipped into a suspension of additional nanoscopic-scale wires and rinsed to create a crossbar array. In arrangement 26 a wire 30 is arranged in crossbar array formation across original wire 18 at junction 32, in contact with wire 18. Arrangement 28 defines an electrical crossbar array comprising at least two nanoscopic wires in crossbar array orientation, where the crossbar array is made up of wires that are not in contact with each other at the junction. These arrangements can be used directly as a bistable device memory element, as will be apparent to those of ordinary skill in the art with the benefit of the description below.

Figure 3A:
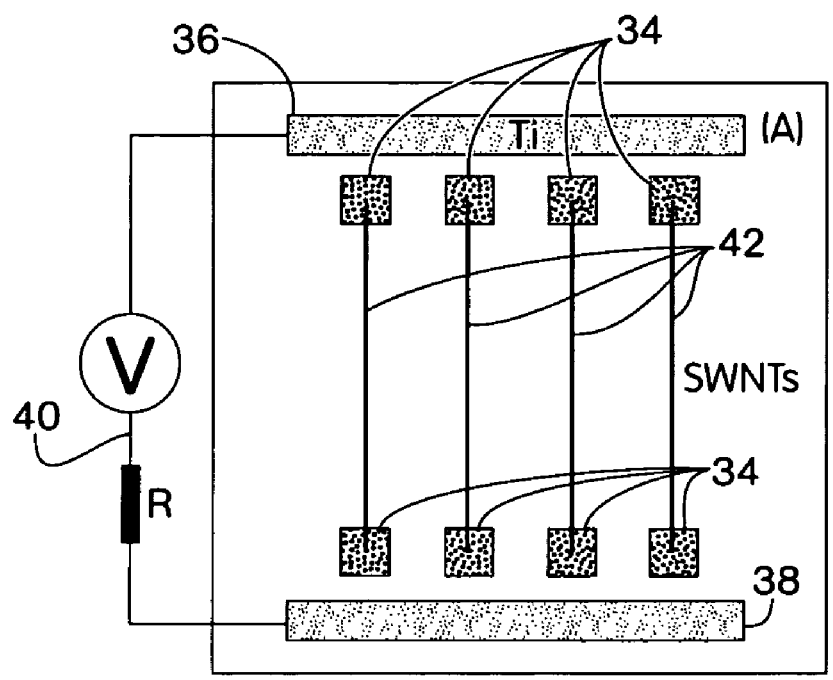
FIGS. 3A and 3B illustrate, schematically, catalytic growth of a two-dimensional nanoscopic wire array.
Figure 3B:
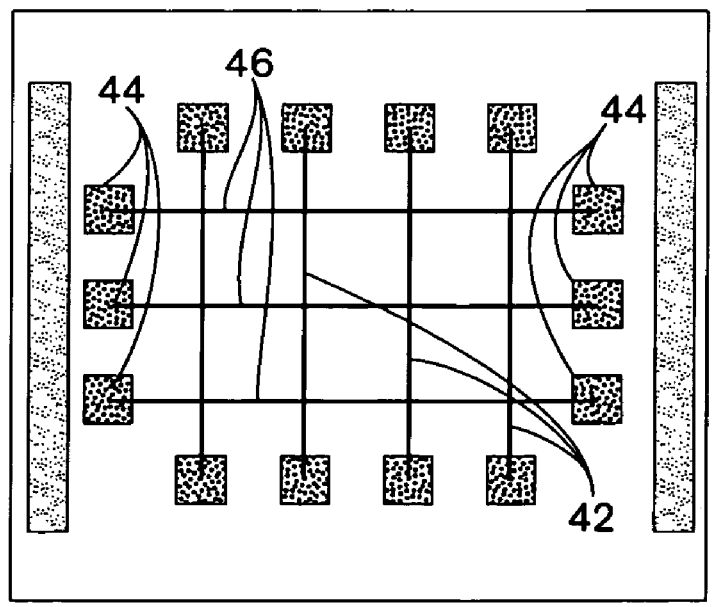

Described above are techniques for assembly of preformed nanoscopic-scale electronic elements onto a surface. Another general technique included in the invention for creation of nanoscopic-scale electronic devices involves directed growth of nanoscopic-scale elements on a surface in a predetermined pattern. FIGS. 3A and 3B illustrate, schematically, one such technique involving formation of crossbar arrays via CVD in the presence of electric fields. In FIG. 3A, an array of catalytic sites 34 are arranged opposite each other and define desired end points of parallel nanoscopic wires of a crossbar array (although pairs of catalytic sites are illustrated, as described below only one catalytic site per wire is needed). Clusters 34 are used to direct the growth of bridging nanoscopic-scale wires in a direction in the presence of an electric field. An electric field is oriented in a direction parallel to (in the direction of) the desired direction of wire growth using electrodes 36 and 38, connected by an electrical circuit 40, oriented behind each array of the diametrically opposed catalytic sites. The underlying basis for the technique is that the energy of a polarizable, anisotropic structure such as a nanoscopic-scale wire formed in accordance with the invention is lower when its long axis is aligned with the field. Correspondingly, when an anisotropic structure is misaligned, there is a force exerted on the structure to bring it into alignment. This basic concept of electric field alignment has been used previously for the alignment of anisotropic molecules through micron scale fibers, and thus the technique will be understood by and reproducible by those of ordinary skill in the art with the benefit of the instant disclosure. The highly anisotropic, or one-dimensional, structure of nanotubes, especially SWNTs, leads to a much greater polarization anisotropy (exceeds 1,000:1 along the tube axis) than would be present for a three-dimensional material of similar dimensions (for example, a copper nanowire), thus nanotubes are particularly preferred for this technique. This will lead to greater energy/force terms for the nanotube aligned with the field. Any slight misalignment with the field during nanotube growth is corrected as the force acting to re-orient it with the field becomes increasingly large as the nanotube grows. An alternative mechanism, for aligning nanotubes growing from an electrode is the accumulation of a net charge on a nanotube and electrostatic attraction to an oppositely biased electrode. According to the technique, the array of diametrically opposed catalytic sites 34, in the presence of an electric field produced by circuit 40 and electrodes 36 and 38, is exposed to conditions of chemical vapor deposition allowing growth of a nanotubes 42 between the catalytic sites.

Re-orientation of the structure such that a series of catalytic sites 44 are diametrically opposed in a direction perpendicular to catalytic sites 34, with creation of an electrical field in a direction perpendicular to nanotubes 42, and exposure to chemical vapor deposition conditions results in deposition of nanotubes 46 aligned in crossbar array orientation perpendicular to nanotubes 42.

Catalyst sites for growing nanoscopic wires can be patterned by lithographic techniques, self-assembly with or without host phases, or patterning via proximal probes (e.g. dip pen lithography).

As mentioned, only one catalyst site per wire is required. With reference to FIG. 3A, one set of catalytic sites 34 can be provided and, in the presence of an electric field and exposure to conditions of CVD nanotubes can be grown from each catalytic site extending away from each site in the same direction to form an array of nanotubes 42 as illustrated. Similarly, with reference to FIG. 3B, only one set of catalytic sites 44 is required. As mentioned above also, other techniques for directing growth of nanoscopic-scale wires can be used such as highly-directional precursor flow rates, template-directed growth, growth within host materials, etc.

A combination of techniques to form crossbar arrays of the invention can be used. With reference to FIG. 2, wires 18 can be formed by any technique, including conventional lithographic techniques. Then, directed growth of nanoscopic-scale elements can take place across SAM sections 22 or 24 resulting in arrangements 26 and 28, respectively.

Nanoscopic wires can also be formed on a surface in a pattern dictated by a mechanically patterned surface. Mechanically patterned surfaces can be provided by walls, channels, trenches, capillaries or the like. Referring back to FIG. 10, article 220 features a plurality of parallel trenches 222 which can be provided in a substrate surface by a variety of means, including lithographic techniques, microcontact printing, nano-imprinting, nano-machining, etching, whether by chemical etching, laser etching, or by a focused ion beam (FIB) machine, and related techniques. Alternatively, some substrates, such as vicinal surfaces or lattice mis-matched hetero-epitaxial structures inherently exhibit such trenches, and thus can also be used as article 220. Article 220 features trenches 222 milled by an FIB. The trenches can serve as a mechanical guide for the growth of nanowires, such as by CVD growth techniques. Crossed wires 233 (FIG. 10B) can be grown by providing a plurality of catalyst nanoparticles 224 (i.e., catalytic sites, FIG. 10A) linearly disposed parallel to trenches 222 and along an edge of article 220. FIG. 10B shows how growth of nanowires 233 can be directed from sites 234 over trenches 232 by techniques such as CVD. The growth can be directed under a local electric field parallel to the surface. The origin of growth is defined by the patterning the catalyst nanoparticles.

Another example of wire growth along a substrate involves an article having a plurality of indentations and protrusions. By positioning protrusions on the substrate surfaces, cavities are formed and defined by the substrate surface and the plurality of indentations. These indentations can have the shape of capillaries. The capillary walls can be used to mechanically direct growth originating from a catalytic site or can be used to chemically pattern a surface which in turn directs growth of the nanowire.

Nanoscopic wires can also be formed on a surface in a pattern dictated by gas flow. For example, disposing a series of catalyst nanoparticles (i.e., catalyst sites) and subjecting these nanoparticles to a gas flow of high pressure can direct growth of a nanowire in the direction of gas flow. Particularly, this method provides a novel growth technique where the gas comprises a reactant for the nanowire. For example, carbon precursor gases such as ethylene, acetylene, methane or carbon monoxide can be used to grow carbon nanotubes whereas silane can be used to grow silicon nanowires. Other precursors are also well known in the art.

Referring again to FIG. 3A and 3B, through placement of catalytic sites 34 and 44 adjacent a series of contact electrodes (not shown), or use of the catalytic sites 34 or 44 as contact electrodes where they are electrically conductive and provide good electric contact with nanotubes, each of the nanotubes can be provided in electrical contact with a different contact electrode. Covalent attachment between nanotubes and contact electrodes is preferred, and is easily facilitated by functionalizing the nanotubes, at their ends, with a molecule that can attach, preferably covalently, to a contact electrode. Functionalization of nanotubes is known, and functional groups that attach to materials that can serve as contact electrodes are known, thus the technique of the invention is readily facilitated based on the instant disclosure. In one embodiment, the ends of the nanotubes are functionalized with conjugated thiols, and the contact electrodes are gold. See, for example, Wong, et al., "Covalently Functionalized Nanotubes as Nanometer Probes for Chemistry and Biology" *Nature* 394, 52-55 (1998); Wong, et al., "Covalently-Functionalized Single-Walled Carbon Nanotube Probe Tips for Chemical Force Microscopy" *J. Am. Chem. Soc.* 120, 8557-8558 (1998), both incorporated herein by reference. The end states of the nanotube can effectively couple to bulk conduction channels in the nanotubes as described by Kim, et al., "Electronic Density of States of Atomically-Resolved Single-Walled Carbon Nanotubes: Van Hove Singularities and End States" *Phys. Rev. Lett.* 82, 1225-1228 (1999), incorporated herein by reference.

Using the techniques of the invention it is possible to achieve an active element two-dimensional density of as high as about $10^{12}$ memory elements/cm$^2$. Thus, low or high density arrays are envisioned. These element can be used to construct non-volatile random access memory (RAM), read-only memory bits and configurable logic, among other applications. This is facilitated where an array of nanoscopic wires 42 (FIG. 3B) are positioned at 20-nanometer intervals. Where wires 46 are similarly arranged, this density is achieved. By using nanoscopic wires such as nanotubes of 10 micron length, with a memory element every 20 nanometers along each nanotube, an array can be formed with at least 500 parallel wires in each direction, each wire containing at least 500 crossbar array junctions (memory elements). At least 250,000 memory elements can be formed in such an array. Three-dimensional arrays can be created as well, and can have higher integration densities than two-dimensional arrays. Three-dimensional arrays are produced using multi layer architecture extended from that described above with reference to FIG. 2 or from assembly using block polymers as directing agents.

As mentioned above, the invention provides a series of memory elements in a crossbar array that can be written and read (switched between "on" and "off" settings) without auxiliary circuitry addressing each element. For example, FIG. 5 shows element 32 is a bistable element in that it is stable in both the "on" and "off" states, and free of auxiliary elements, such as capacitors, transistors and switches.

Figure 5A:
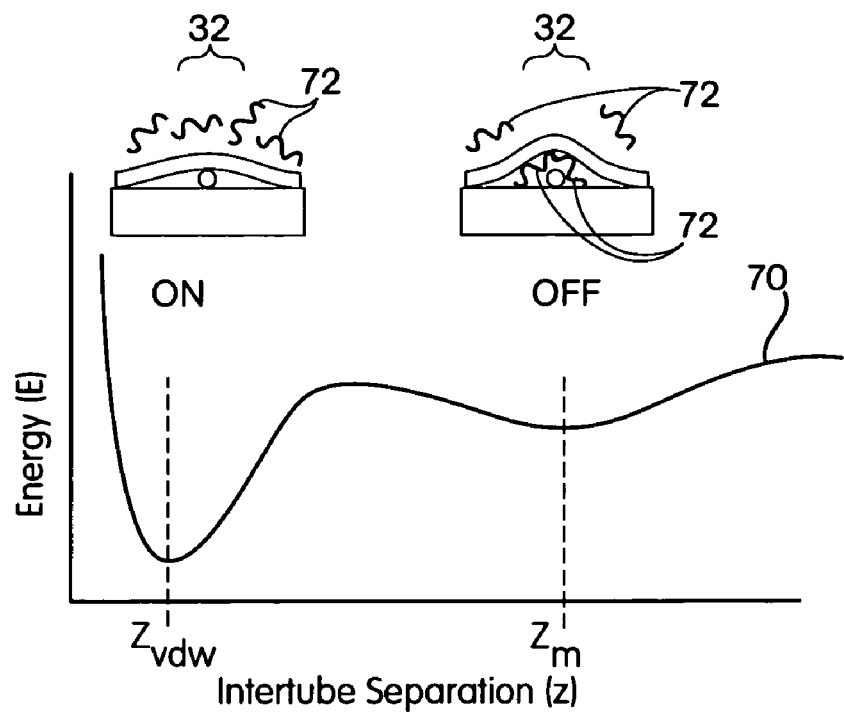
FIG. 5 illustrates, schematically and graphically, a bistable/nanoscopic wire junction (memory element) and switching mechanism in terms of energy.
Figure 5B:
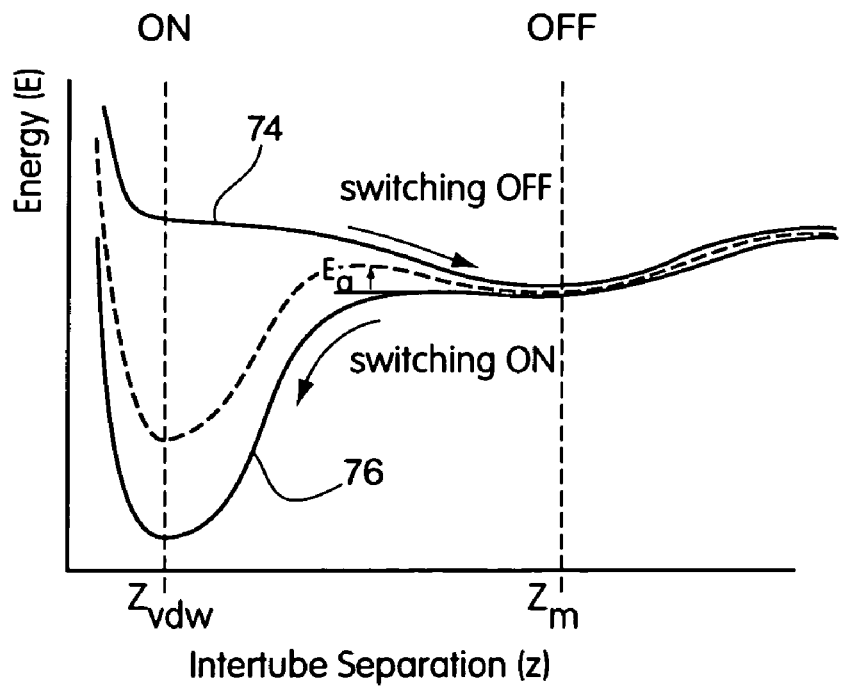
Figure 6A:
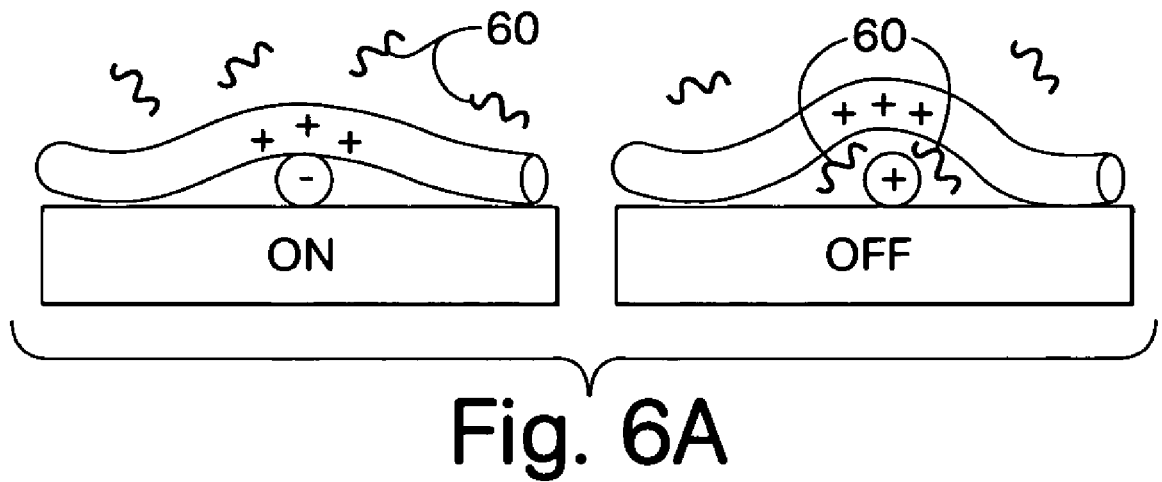
FIGS. 6A, 6B, and 6C illustrate, schematically, bistable nanoscopic wire crossbar memory elements (crossbar junctions) in "on" and "off" states including three arrangements for provision of separate oppositely charged molecules.
Figure 6B:
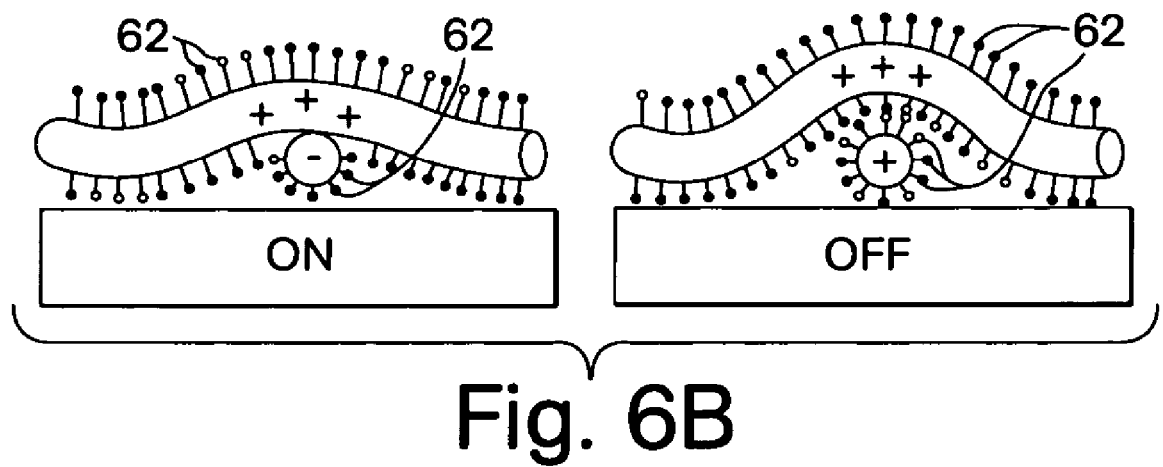
Figure 6C:
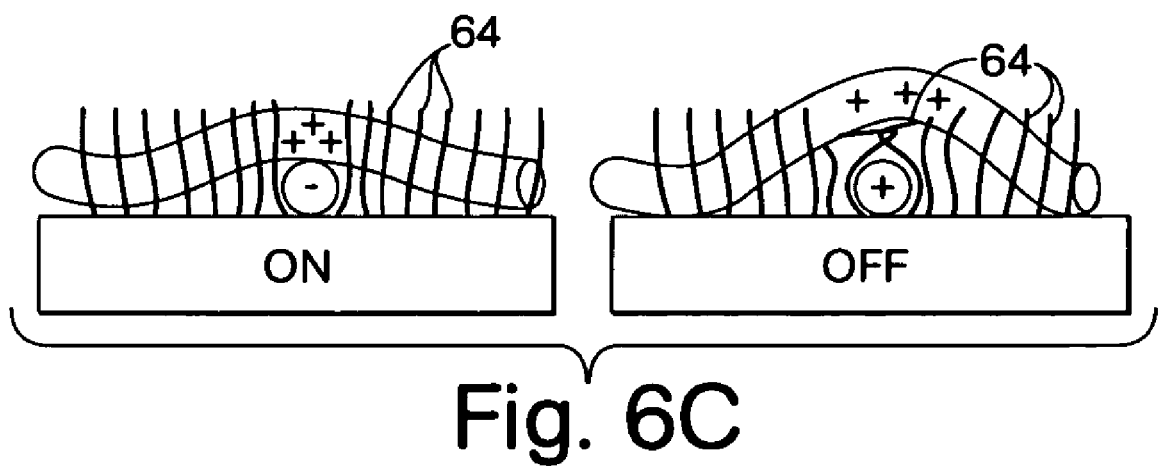

Referring now to FIG. 5, a stable/metastable memory element 32 according to arrangement 26 of FIG. 2 is illustrated, schematically and graphically. As illustrated, two touching crossed wires 18 and 30 in the "on" state are biased against an underlying ground. Curve 70 represents the energy states in the various conformations. Switching "off" (curve 74): when the wires are biased with similar polarity, they are repelled from each other and spatially separated. They can rapidly return to a metastable distance where they are separated by space or molecules 72 filling the gap between them. This metastable "off" state slowly relaxes back to the "on" state within a retention time. Switching "on" (curve 76): when the nanotubes are biased with opposite polarity, they attract each other, accelerate their relaxation to a van der Waals contact distance. FIGS. 6A-6C illustrate various embodiments in which oppositely charged molecules are allowed to organize within cross junctions between nanotubes in the "off" state according to the arrangement of FIG. 5. These molecules can include short charged polymers 60 (FIG. 6A), surfactant molecules 62 that can form micellar structures around nanotubes (FIG. 6B), polymer brushes 64 grafted to a SAM that forms a basis of the structure (FIG. 6C), and the like.

Another aspect of the invention provides an article comprising an electrical crossbar array comprising at least two crossed wires defining a diode. The device is free of auxiliary circuitry other than the at least two crossed wires defining the diode. For example, if bound wires are semiconducting and support wires are metallic conductors, contact between the two wires will provide a metal/semiconductor junction, which functions as a rectifying Schottky diode at the contact junction. Thus, an on junction provides intrinsic rectifying behavior. Currently, nanotubes exist as a mixture of semiconductor and metallic conductor nanotubes. It has not been possible to separate the mixture into purely semiconducing nanotubes and metallic nanotubes. Rectifying junctions can also be provided by providing semiconductor nanowires, preferably n-type. For metallic nanotubes, a rectifying Schottky junction will result in the "on" state while for semiconducting nanotubes (which are intrinsically p-type) a rectifying p/n diode junction will result if the semiconducting nanowire is n-type doped.

Figure 9A:
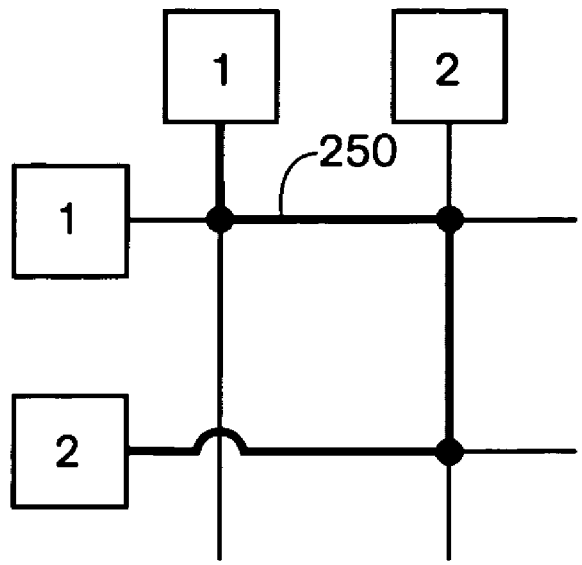
FIG. 9A shows a top view of a crossbar array, illustrating cross talk.
Figure 9B:
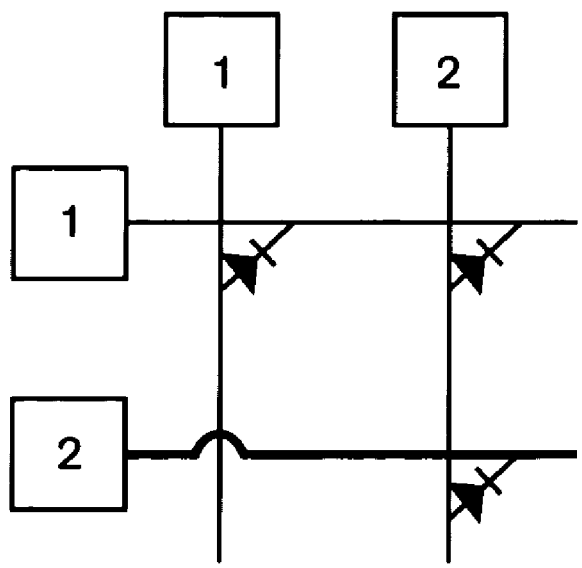
FIG. 9B shows a top view of a crossbar array having diode junctions featuring intrinsic rectifying behavior.

The provision of diode junctions can eliminate the problem of cross talk in crossbar arrays. FIG. 9A shows an example of a 2×2 array in which bit [21] is off. Thus, a direct conducting path between bit [21] and bit [11] is not acceptable. Because there is no restriction on a direction for a conduction pathway, a pathway as represented by bold line 250 can circumvent the [21]/[11] pathway. This will cause bit [21] to appear on even though it is off FIG. 9B shows a result of rectifying behavior when one set of crossed wires comprises a semiconductor and the other set of crossed wires comprises a metallic conductor. Conducting is limited to one direction only and cross talk is thus prevented.

As mentioned previously, providing pure semiconductor nanotubes or metallic nanotubes has not been possible to this point. Thus, another aspect of the present invention provides a method involving a mixture of metallic nanotubes and semiconducting nanotubes. The method involves separating the metallic nanotubes from the semiconducting nanotubes. It is known that metallic nanotubes have a greater polarizability than semiconducting nanotubes by about three orders of magnitude. Thus, in one embodiment, the step of separating the mixture involves subjecting the mixture to an electric field of intensity sufficient to selectively orient metallic nanotubes. Depending on the intensity of electric field, there is a critical length below which only metallic nanotubes will be aligned. Thus, the intensity can be adjusted to be in accord with a field below the critical length. Above this critical length, both types of nanotubes can be aligned by the field. Below this length, the electric field is of an intensity such that the semiconducting nanotubes remain unoriented with respect to the electric field. Once selective alignment is achieved, separation is routine.

As noted above, it is a significant advantage of the invention that junction elements can be switched between "on" and "off" states remotely, i.e., by simply addressing at least one end of each of the wires that cross to form the memory element (wires 18 and 30 in FIGS. 2 and 4). Where the junction elements comprises memory elements, or diodes, some or preferably all of the memory elements are free of auxiliary circuitry defining the memory or diode elements and free of auxiliary circuitry addressing the memory or diode elements to switch them between states; the memory or diode element simply includes wires 18 and 30 that define the lead wires addressing the memory or diode element. Those of ordinary skill in the art will understand the meaning of auxiliary circuitry for switching a memory or diode element between "on" and "off" states, auxiliary circuitry defining memory states themselves, and the meaning of a device free of these components. An example of auxiliary circuitry defining memory states themselves includes an electrical pathway connecting two crossed conductors at a junction that can be switched from a conducting state to a non-conducting state. An example of auxiliary circuitry for switching a memory element between states includes circuitry connected to the electrical pathway that can be switched to render the pathway conducting or non-conducting.

One feature of the invention is that, with reference to FIG. 2, nanoscopic-scale wires 18 and 30 need not each be flexible nanoscopic wires such as nanotubes. As can be seen from the illustration and description relating to FIGS. 4 and 5, memory elements of the invention each include one wire (wire 18 in FIGS. 4 and 5) that need not move during switching, and can be made of essentially any material having appropriate conductivity that can be formed in the appropriate dimensions. Although nanotubes and other nanoscopic wires can be used for fixed wires 18, wires formed by more conventional techniques such as lithography can be used as well. Wire 30 should be selected to meet the additional requirement of repeated flexure during switching between "off" and "on" states, as illustrated. Wire 30 should thus be selected to have elasticity and robustness to meet this demand. Nanotubes exhibit such robustness and are ideal for use as flexing wires 30 in the invention. Thus, devices of the invention can be constructed entirely by directed assembly of pre-formed wires onto a surface or entirely from directed growth of wires at a surface, or a combination, or fixed wires 18 can first be formed via a conventional technique such as lithography followed by placement of flexing wires 30 by directed assembly, or directed growth.

Figure 7:
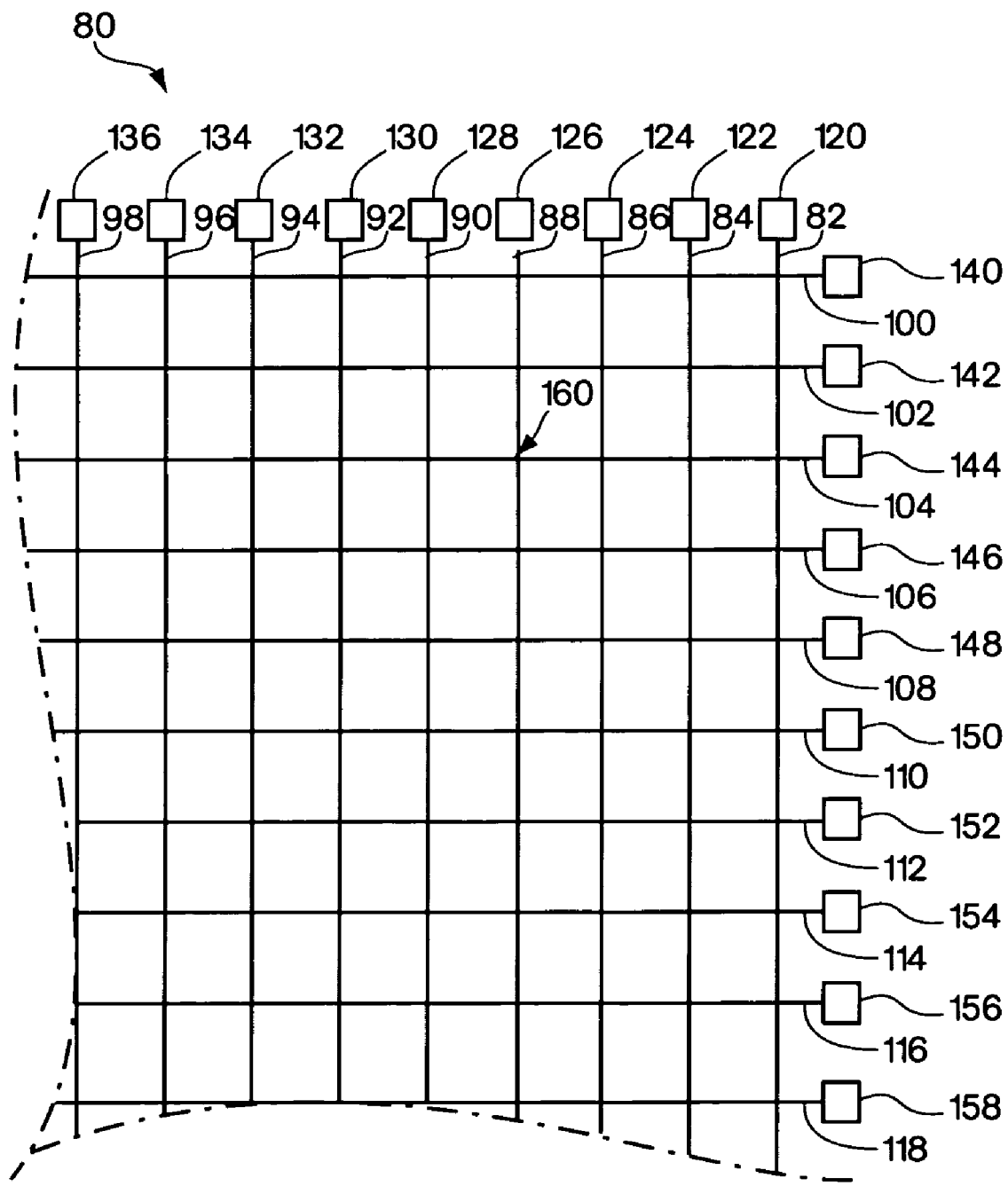
FIG. 7 is a cut away schematic illustration of a crossbar array of the invention.

Referring now to FIG. 7, a cut away schematic illustration of a crossbar array 80 of the invention is presented. Array 80 includes a series of parallel, equally-spaced wires 82, 84, 86, 88 . . . , and a series of parallel, equally-spaced wires 100, 102, 104, 106 . . . that cross (are perpendicular to) wires 82, 84 . . . . Each of wires 82, 84, 86 . . . is addressed by an electrode 120, 122, 124 . . . at one end thereof and each of wires 100, 102, 104, 106 . . . is addressed by an electrode 140, 142, 144 . . . at one end thereof. It is a feature of the invention that wires 82, 84, 86 . . . and wires 100, 102, 104 . . . require electrical contact with only one electrode, i.e., one interconnect can be used to address many individual junctions. Electrodes can be provided at opposite ends of the wires from those ends at which electrodes are shown (opposite ends not shown in FIG. 7), but this is optional. Each of wires 82, 84, 86 . . . crosses each of wires 100, 102, 104 . . . , each crossed wire junction defining a memory element as illustrated in FIGS. 2, 4, and 5 and discussed above. For example, junction 160 is a memory element defining the intersection of wires 88 and 104. When device 80 is constructed of memory elements as illustrated in arrangement 28 of FIG. 2, and in FIG. 4, at mechanical equilibrium wires 88 and 104 are free of contact and element 160 is "off". Biasing electrodes 126 and 144 at opposite polarity brings wires 88 and 104, at junction 160, into contact with each other (stable Van der Waals contact) and junction 160 is switched "on". Bias need not be maintained between electrodes 126 and 144 to maintain element 160 in the "on" state in preferred embodiments. To switch element 160 "off", electrodes 126 and 144 are biased with the same polarity to repel wires 88 and 104 from each other at junction 160. Where device 80 includes junctions as illustrated in arrangement 26 of FIG. 2 and FIG. 5, at mechanical equilibrium junction 160 is in the "on" state with wires 88 and 104 contacting each other, and element 160 is switched "off" by biasing electrodes 126 and 144 at similar polarity. Switching element 160 back "on" is accomplished by biasing electrodes 126 and 144 at opposite polarity.

Another aspect of the present invention provides an article comprising an electrical crossbar array comprising at least two crossed nanoscopic wires defining a memory element capable of being switched irreversibly between at least two readable states. Thus, the device is "read-only". In another embodiment, the article comprises an electrical crossbar array comprising at least two crossed nanoscopic wires defining a memory element capable of being switched reversibly. Thus, the devices can be used for a volatile RAM (e.g. require a power supply to keep the stored information) or a non-volatile RAM.

Example 1

Figure 11:
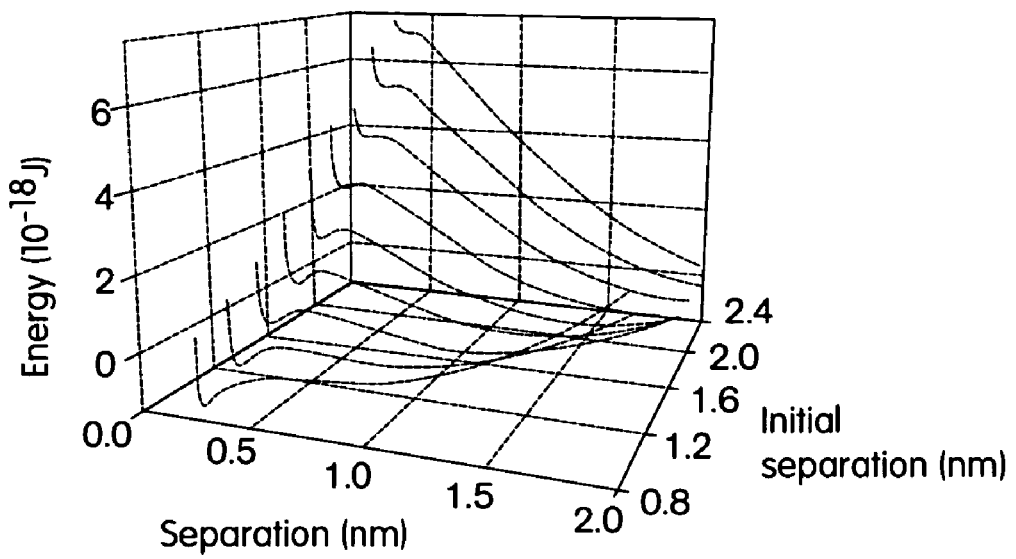
FIG. 11 shows plots of energy, $E_T$ for a single 20 nm device as a function of separation at a junction.
Figure 12:
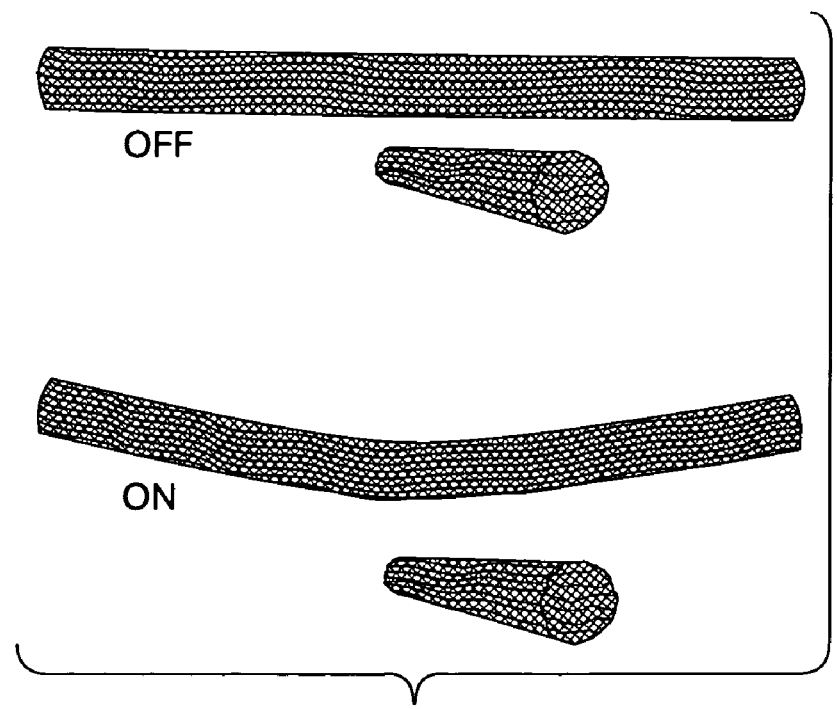
FIG. 12 shows calculated structures of single wall nanotubes (SWNTs) in the off and on states for an initial separation of 2 nm.
Figure 13:
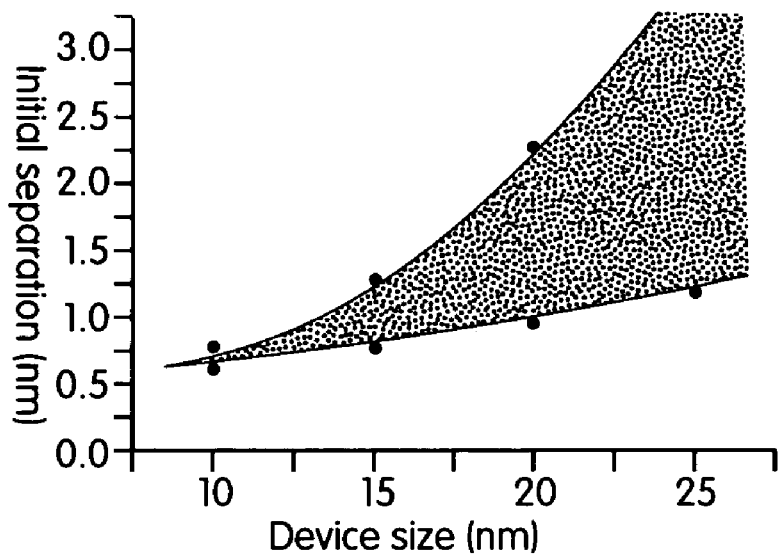
FIG. 13 shows a plot of a calculated range of initial separations for a range of device sizes which yield bistable devices for a hard material such as silicon.
Figure 14:
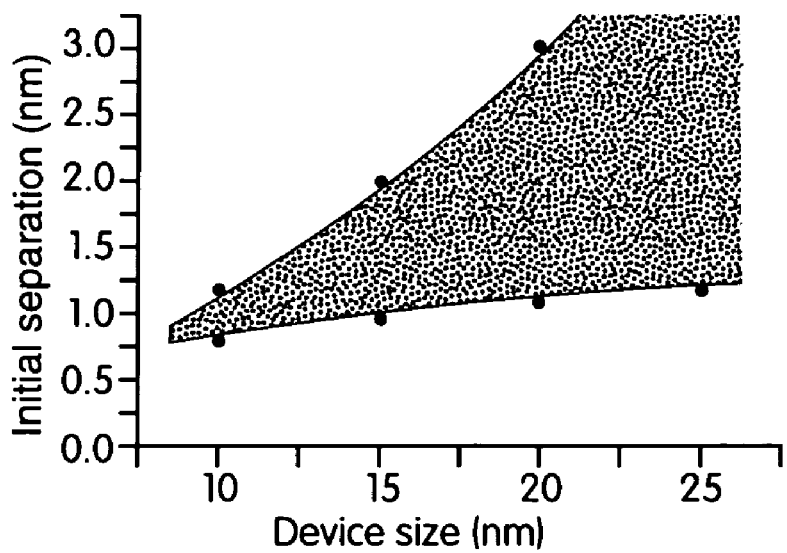
FIG. 14 shows a plot of a calculated range of initial separations for a range of device sizes which yield bistable devices for soft organic materials.

To quantify the bistability and switching behavior of the device element a total energy, $E_T$, can be calculated:

$$E_T = E_{vdW} + E_{elas} + E_{elec} \tag{1}$$

where $E_{vdW}$ is the van der Waals (vdW) energy, $E_{elas}$ is the elastic energy and $E_{elec}$ is the electrostatic energy for the device. The first two terms in (1), which define the static potential, can be evaluated to assess the range of parameters that yield bistable devices. FIG. 11 shows plots of energy, $E_T = E_{vdW} + E_{elas}$, for a single 20 nm device as a function of separation at the junction. The series of curves correspond to initial separations of 0.8, 1.0, 1.2, 1.4, 1.6, 1.8, 2.0, 2.2, 2.4 nm for carbon nanotubes, with two well-defined minima observed for initial separations of 1.0 to 2.0 nm. These minima correspond to the crossing nanotubes being separated (2.4 nm) and in vdW contact (0.8 nm). The vdW interaction between nanotubes can be calculated by pairwise summation of a Lennard-Jones potential that has been shown previously to provide good agreement with experiment for fullerene and nanotube systems. The elastic contribution to the total energy can be determined using a beam mechanics model:

$$E_{elas} = \frac{6(k^3 B)^{1/4}}{\sqrt{2}\,[3 + 3\beta L + 3(\beta L)^2 + (\beta L)^3]}(\delta z)^2 \quad (2)$$

where B is the product of the nanotube elastic modulus and geometric moment of inertia, k is the elastic modulus of the support, L is the length of the suspended nanotube, $$\beta = \frac{1}{\sqrt{2}}(k/B)^{1/4},$$

and δz is the displacement of the suspended tube from its unstrained position. These calculations show that the proposed SWNT device structure exhibits bistablility for a broad range of parameters (FIG. 11). For example, a 20 nm device in FIG. 11 exhibits room temperature stable (i.e., barrier>>10 $k_B T$) on and off states for initial separations ranging from 1.0 to 2.2 nm. The calculated structures of the SWNT device element in the off state and on state for an initial separation of 2 nm (FIG. 12) highlight the relatively minor distortion of the upper SWNT in the on state, even when the initial separation is near the upper limit for bistability. Si support structures (elastic modulus of 16 GPa) are not shown for clarity. These calculations also show that the potential is bistable for a wide range of device sizes when the upper nanotube is supported on either hard materials, such as silicon (FIG. 13) or soft organic (FIG. 14) materials. FIG. 14 shows calculations on an organic layer having an elastic modulus of 12 GPa. In FIGS. 13 and 14, the range of initial separations yielding bistable devices is shown in gray. Importantly, soft supports enable bistability for smaller devices. Both types of materials can be used for device fabrication. In general, the bistable region increases with device size, and the softer organic support yields a larger range of bistability especially in the smallest structures. The calculations were 15 carried out for (10,10) SWNTs with an elastic modulus of 1 TPa, and Lennard-Jones parameters of $C_6=32.00\times10^{-60}$ erg cm$^6$ and $C_{12}=55.77\times10^{-105}$ erg cm$^{12}$.

There are several important points that can be drawn from these calculations. Foremost, is the wide range of parameters that yield a bistable potential for the device configuration. The robustness of the on/off states suggests strongly that this architecture will be tolerant of variations in structure that inevitably arise during fabrication by, for example, self assembly. Second, the differences in separation between nanotubes in the on and off states will produce large differences in resistance (i.e., I~exp(-kd), where I is the current, k is a decay constant of order 2 Å$^{-1}$ and d is the tube-tube separation in angstroms), and thus should enable reliable reading of the on/off states independent of variations in cross contact resistance. Third, the range of mechanical strains required to achieve bistability in FIG. 11, 0.22-1.7%, is well below the elastic limit of at least 6% determined computationally and experimentally for SWNTs, and the average bending angle in the on state is ca. ½ that required to buckle nanotubes. Hence, these device elements can be robust as required for a reliable molecular scale computer. Comparison of the calculated strain energies to values of the nanotube-surface interaction and friction suggests that (i) the lower nanotube remains fixed on the substrate, and (ii) the suspended nanotubes do not lift off or slip on supports on the order of 10 nm when the suspended tube is deflected to the on state. The interaction with the support could also be enhanced through chemical modification.

Example 2

The effectiveness of switching the suspended nanotube devices between on and off states has been assessed by evaluating the voltage-dependent contribution of the electrostatic energy to the total energy. In this calculation, the boundary element method was used to numerically solve the Laplace equation for the complex three-dimensional geometry of the crossed nanotube device. Calculations of $E_T$ for switching a 20 nm device on and off (FIG. 15) demonstrate that it is possible to change reversibly between the on/off states using moderate voltages, which do not exceed the threshold field for nanotube failure. The switching voltages vary depending on the specific device geometry (i.e., shape of the static potential), and thus can be further optimized. For example, by using a thinner dielectric layer (that is, 4 vs 20 nm SiO$_2$) the on and off switching thresholds can be reduced from 4.5 and 20 V to 3 and 5 V, respectively. The calculations also show that the electrostatic forces between adjacent nanotubes are insufficient to distort an array of elements, even at a 10 nm device scale, because most of the electrostatic interaction is localized in the small crossing region of the individual elements.

Figure 15A:
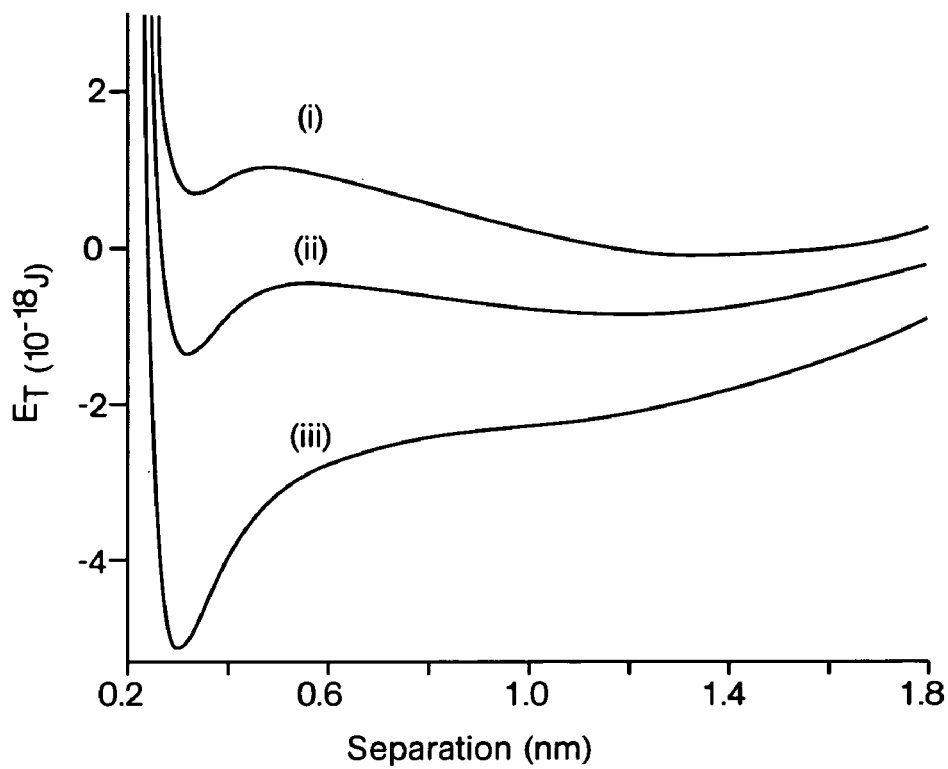
FIG. 15 shows calculations of $E_T$ for switching a 20 nm device on (FIG. 15A) and off (FIG. 15B)
Figure 15B:
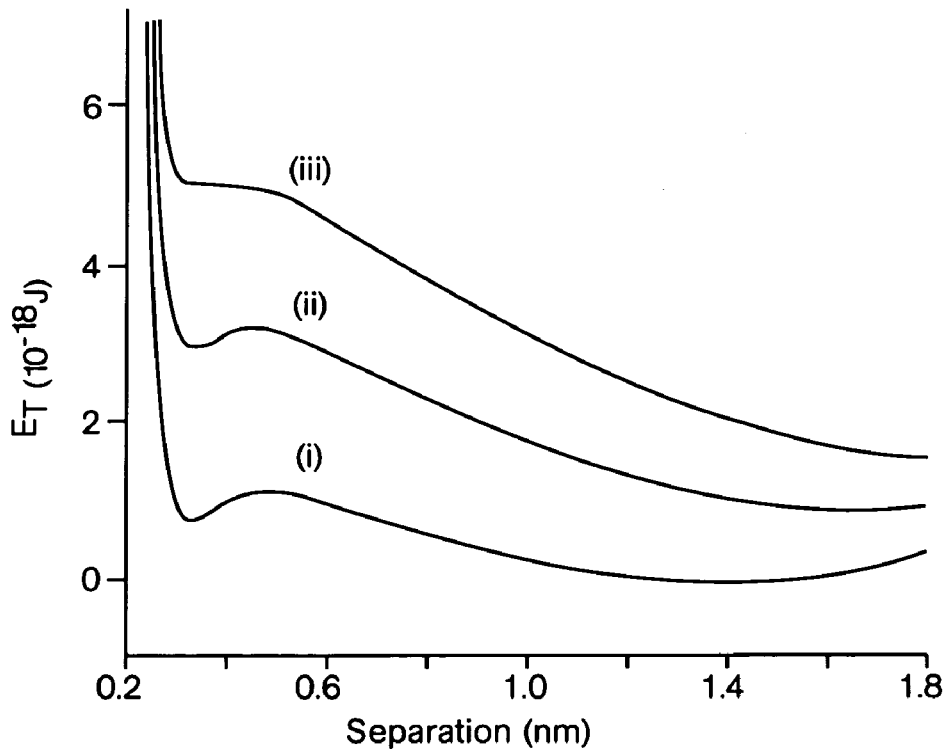

This example provides a demonstration of electrostatic switching of the nanotube device. FIG. 15 shows plots of the energy, $E_T=E_{vdW}+E_{elas}+E_{electro}$, as a function of separation at the junction for switching on (FIG. 15A) and switching off (FIG. 15B). In FIG. 15A, the plots (i), (ii) and (iii) correspond to $E_T$ for $V_1=V_2=0$ V, $V_1=+3$; $V_2=-3$ V and $V_1=+4.5$; $V_2=-4.5$ V, respectively, where $V_1$ and $V_2$ are the potentials applied to the two crossing nanotubes. In FIG. 15B, (i), (ii) and (iii) correspond to $V_1=V_2=0$ V, $V_1=V_2=+15$ V and $V_1=V_2=+20$ V, respectively. These potentials are applied with respect to the conducting ground plane (e.g., FIG. 1A). The minimum magnitudes of the voltages required for switching on and off are 4.5 V and 20 V, respectively. The electrostatic energy was calculated by numerically solving the Laplace equation using the boundary element method with 3600 elements for a 20 nm device supported on Si with a 1.4 nm initial separation. The calculated electrostatic potential satisfied the boundary conditions and asymptotic behavior.

Example 3

Figure 16A:
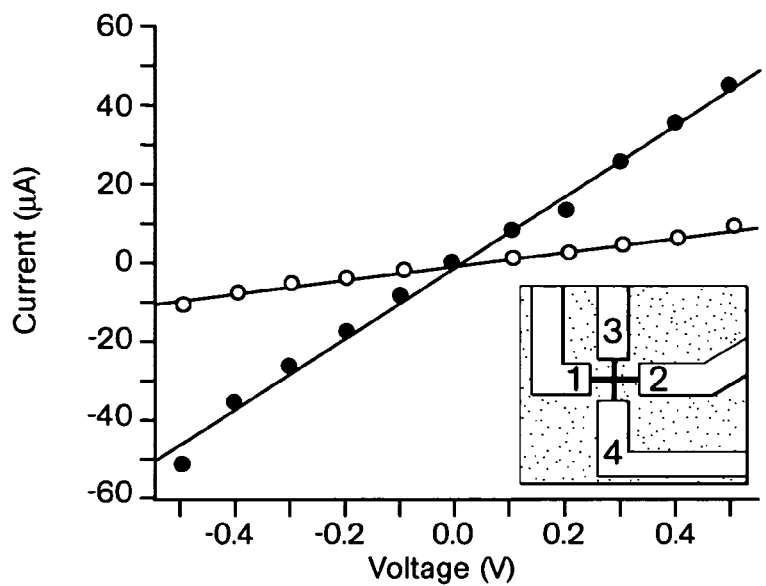
FIG. 16A shows current-voltage (I-V) measurements made on lower (bound) and upper (supported) nanotubes of a typical device showing ohmic behavior with resistances of 11 and 58 k$\Omega$.
Figure 16B:
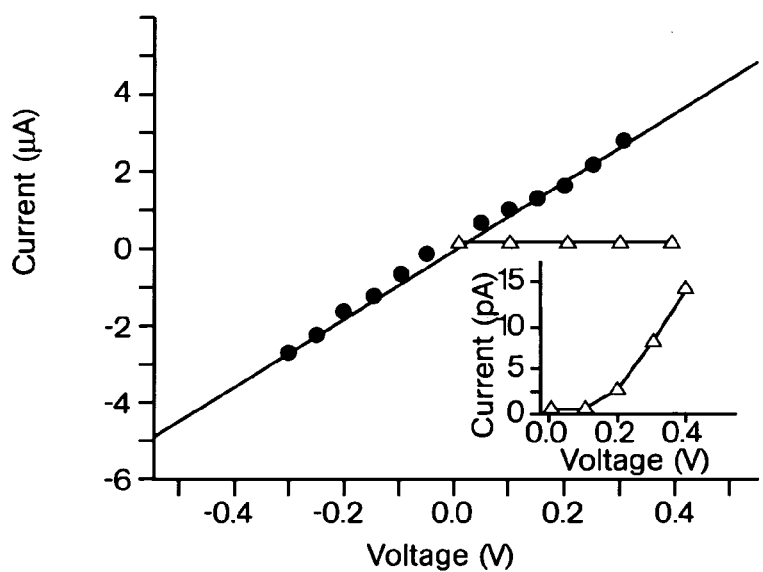
FIG. 16B shows current-voltage (I-V) measurements made on lower (bound) and upper (supported) nanotubes of a typical device showing ohmic behavior with resistance of 112 k$\Omega$.
Figure 17:
FIG. 17 shows a plot of device state (on) and (off) vs. resistance.

Administration of reversible switching and the ability of the device to function as a non-volatile RAM is provided in this Example. Properties of suspended, crossed nanotube devices made from SWNT ropes were studied by mechanical manipulation (FIG. 16). Current-voltage (I-V) measurements made on the lower and upper nanotubes of a typical model device show ohmic behavior with resistances of 11 and 58 kΩ, respectively (FIG. 16A). The I-V curves between the upper and lower ropes in the off state were nonlinear, which is consistent with tunneling, with a resistance on the order of a GΩ. After switching on, the I-V curves exhibited ohmic behavior with a resistance of 112 kΩ (FIG. 16B). This large change in resistance is consistent with our predictions for off vs. on states in the suspended device architecture. Reversible switching between well-defined on/off states has also been observed in devices (FIG. 17). The smaller change in on off resistances for the device in FIG. 17 is believed to arise from large contact resistances that are sometimes observed with nanotube ropes. Nevertheless, this change between on/off states is 10-fold, and was persistent. Lastly, it has been found that some of the devices fabricated from ropes could only be switched on for reasonable applied voltages. This behavior is expected for potentials that have deep vdW minima (e.g., FIG. 11). Irreversible switching can be exploited to configure logic elements for computing.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. An article, comprising:

an electrical crossbar array defined by a plurality of conductors and a plurality of nanotubes which cross the plurality of conductors at intersections, wherein a plurality of the intersections are unique data storage elements and are switched between at least "on" and "off" readable states by solely applying dissimilar or similar electrical potential to one or more of the conductors and one or more of the nanotubes that define the unique data storage elements, whereby for each of said elements, the one or more nanotubes deforms and electrically connects, or disconnects, respectively, to the one or more conductors to switch the unique data storage element to the "on" or "off" state, respectively, upon the application of the dissimilar or similar electrical potential, and whereby when switched to the "on" or "off" state, the unique data storage element remains in said state absent application of a similar, or dissimilar electrical potential, respectively, to the one or more conductors and the one or more nanotubes defining the unique data storage element, but when a similar, or dissimilar electrical potential, respectively, is applied between the one or more conductors and the one or more nanotubes defining the unique data storage element, the unique data storage element returns to an "off" or "on" state, respectively.

* * * * *